US012176340B2

(12) United States Patent
Oseto et al.

(10) Patent No.: US 12,176,340 B2
(45) Date of Patent: Dec. 24, 2024

(54) PHOTOELECTRIC CONVERSION APPARATUS HAVING SEMICONDUCTOR SUBSTRATES AND PROTECTION CIRCUITS

(71) Applicant: CANON KABUSHIKI KAISHA, Tokyo (JP)

(72) Inventors: Akira Oseto, Kanagawa (JP); Nobuaki Kakinuma, Tokyo (JP); Tatsunori Kato, Kanagawa (JP); Ryunosuke Ishii, Saitama (JP); Koji Hara, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 316 days.

(21) Appl. No.: 17/317,605

(22) Filed: May 11, 2021

(65) Prior Publication Data

US 2021/0358904 A1    Nov. 18, 2021

(30) Foreign Application Priority Data

May 14, 2020   (JP) ................................ 2020-084828

(51) Int. Cl.
*H01L 27/02*   (2006.01)
*H01L 23/00*   (2006.01)
*H01L 27/146*  (2006.01)

(52) U.S. Cl.
CPC .......... *H01L 27/0255* (2013.01); *H01L 24/08* (2013.01); *H01L 27/14621* (2013.01);
(Continued)

(58) Field of Classification Search
CPC ................. H01L 27/0255; H01L 24/08; H01L 27/14634; H01L 27/14636; H01L 27/14645; H01L 2224/08145
See application file for complete search history.

(56) References Cited

U.S. PATENT DOCUMENTS

2015/0155318 A1* 6/2015 Kobayashi .......... H01L 27/1464
                                                                  250/208.1
2016/0126285 A1* 5/2016 Kobayashi .......... H01L 27/0296
                                                                  438/60
(Continued)

FOREIGN PATENT DOCUMENTS

JP    H08317288 A    11/1996
JP    2005322826 A   11/2005
(Continued)

*Primary Examiner* — Thao X Le
*Assistant Examiner* — Bruce R. Smith
(74) *Attorney, Agent, or Firm* — Canon U.S.A., Inc. I.P. Division

(57) ABSTRACT

A photoelectric conversion apparatus includes a pad, a first protection circuit provided on a first semiconductor substrate, and a second protection circuit provided on a second semiconductor substrate. The first semiconductor substrate, which includes a plurality of photoelectric conversion units each receiving incident light and generating signal charge, and the second semiconductor substrate, which includes at least one signal processing circuit that processes an input signal based on the generated signal charge, are laminated. The pad receives a power supply voltage as input from an outside of the photoelectric conversion apparatus. At least one of the first protection circuit or the second protection circuit is provided on an outside of a region in which the pad is provided, in planar view. At least one of the first protection circuit or the second protection circuit is connected to the pad.

22 Claims, 30 Drawing Sheets

(52) U.S. Cl.
CPC .. *H01L 27/14627* (2013.01); *H01L 27/14634* (2013.01); *H01L 27/14636* (2013.01); *H01L 27/14645* (2013.01); *H01L 2224/08145* (2013.01)

(56) References Cited

U.S. PATENT DOCUMENTS

| | | | |
|---|---|---|---|
| 2017/0250172 A1* | 8/2017 | Huang | H01L 23/60 |
| 2017/0257590 A1* | 9/2017 | Kato | G01S 1/00 |
| 2018/0040660 A1* | 2/2018 | Kondo | H01L 27/14634 |

FOREIGN PATENT DOCUMENTS

| | | | |
|---|---|---|---|
| JP | 2012019147 A | 1/2012 | |
| JP | 2012033878 A | 2/2012 | |
| JP | 2012033894 A | 2/2012 | |
| JP | 2013182941 A | 9/2013 | |
| JP | 2017157803 A | 9/2017 | |
| JP | 2019046864 A | 3/2019 | |

* cited by examiner

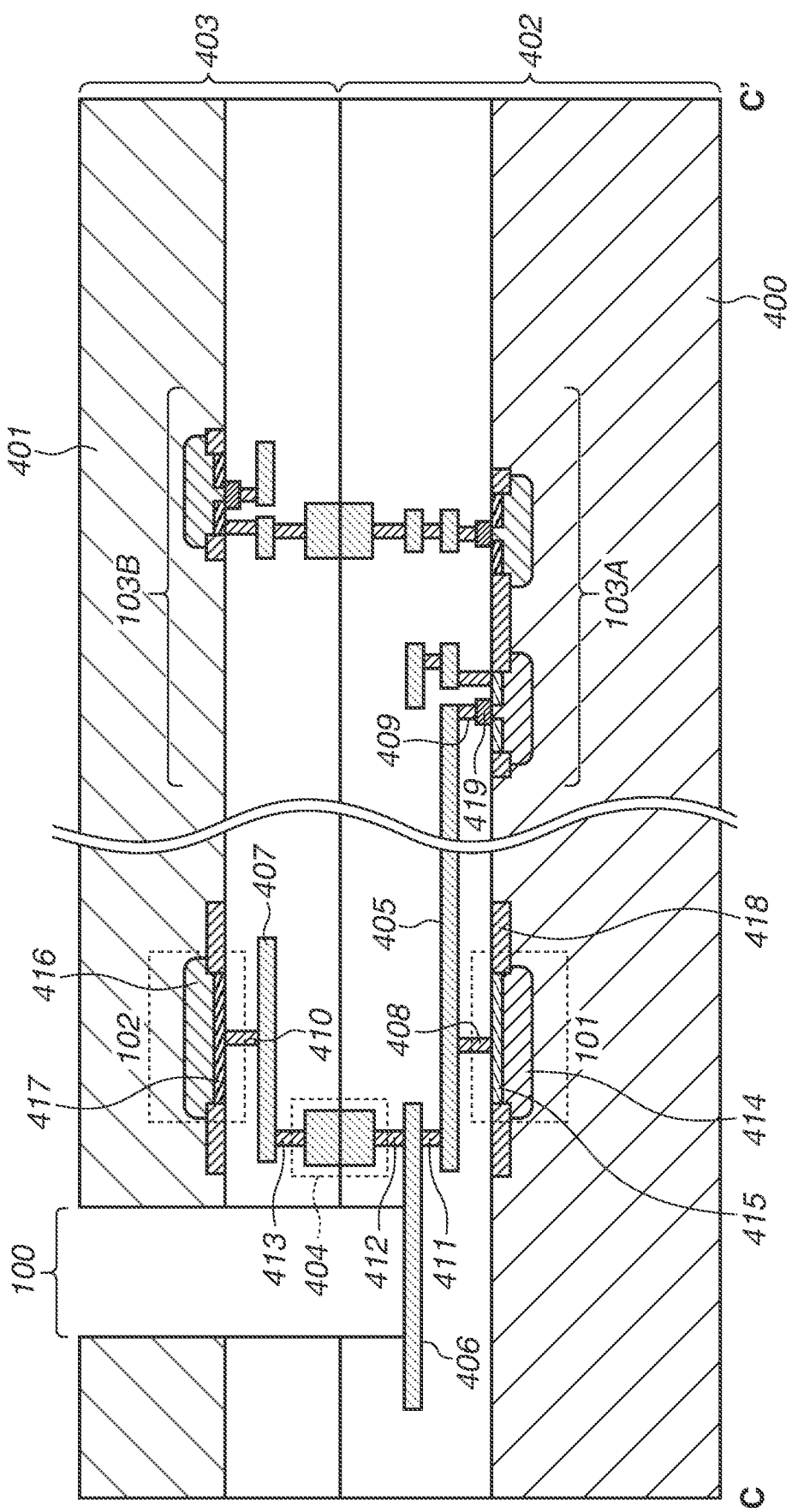

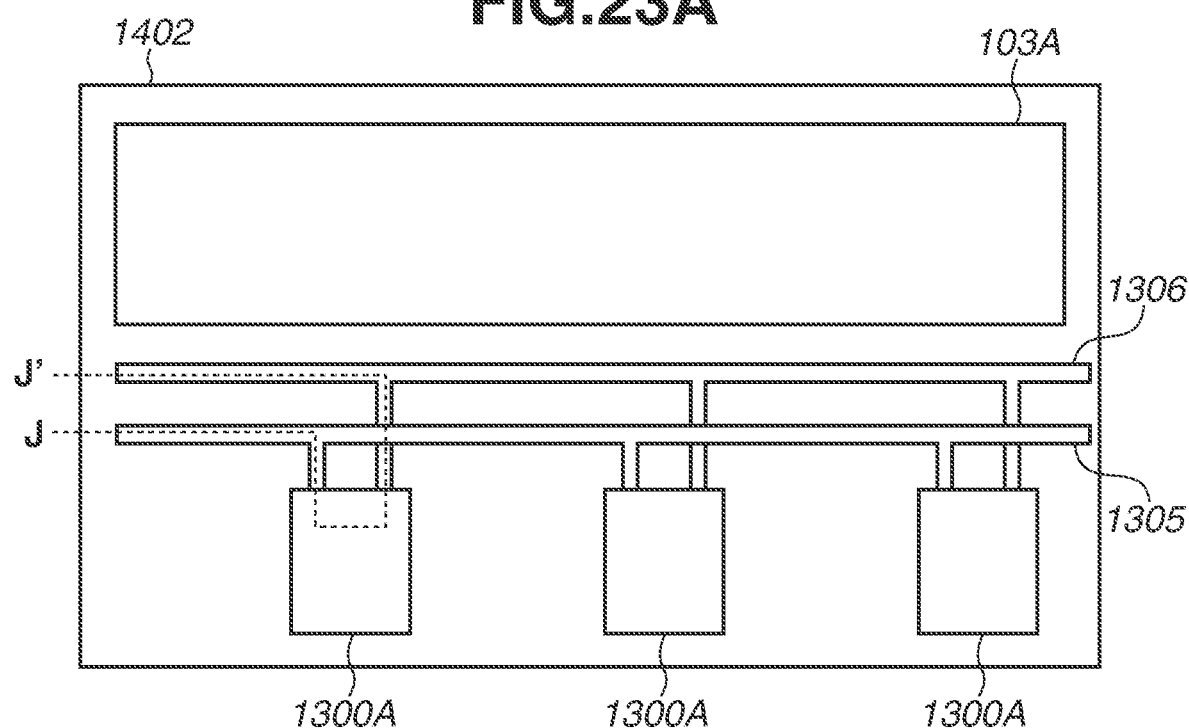
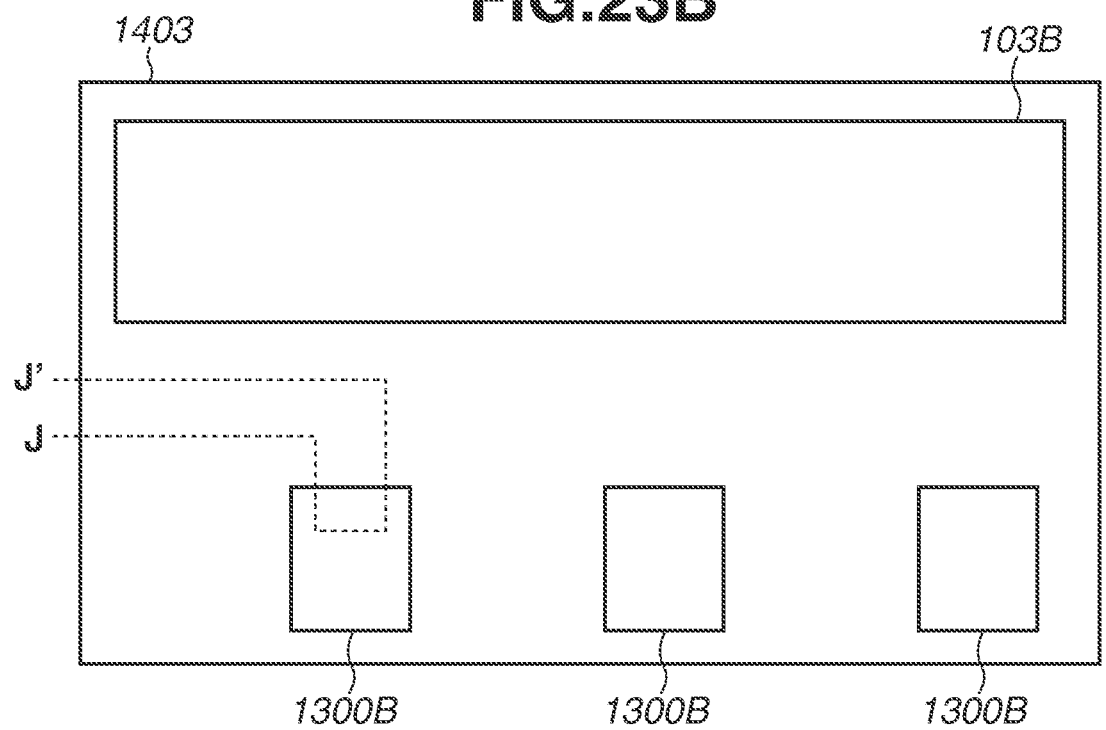

PHOTOELECTRIC CONVERSION APPARATUS HAVING SEMICONDUCTOR SUBSTRATES AND PROTECTION CIRCUITS

BACKGROUND FIELD

The present disclosure relates to a photoelectric conversion apparatus, a photoelectric conversion system, and a movable body.

DESCRIPTION OF THE RELATED ART

In the field of photoelectric conversion apparatuses, miniaturization has been advanced. With the advancement of miniaturization, gate oxide films in metal-oxide semiconductor (MOS) transistors have become thinner, for example. This lowers the voltage at which dielectric breakdown of the MOS transistors occurs. As a configuration to reduce this dielectric breakdown, a configuration including a protection circuit has been known.

By increasing the area of the protection circuit, it is possible to reduce the load on the photoelectric conversion apparatus due to an electrostatic discharge. However, if the occupied area of the protection circuit is increased, the area of the other circuit (the internal circuit provided in the photoelectric conversion apparatus) is reduced. Alternatively, if the area of the internal circuit is secured, the chip area increases. According to the technique discussed in Japanese Patent Application Laid-Open No. 2012-033878, a protection circuit is arranged in a region overlapping a pad, to which a voltage is supplied from the outside, in planar view. This can increase the area of the protection circuit while suppressing the increase of the chip area.

In a case where the protection circuit is provided in the region overlapping the pad in planar view, when wire bonding is performed on the pad, the protection circuit may receive a pressure. In this case, the characteristics (including electrostatic resistance) of the protection circuit change. As a result, an electrostatic noise is mixed into a signal generated by the photoelectric conversion apparatus or the internal circuit is damaged, and thus the operation reliability of the photoelectric conversion apparatus may degrade.

SUMMARY

According to an aspect of the present disclosure, a photoelectric conversion apparatus in which a first semiconductor substrate, which includes a plurality of photoelectric conversion units each configured to receive incident light and generate signal charge, and a second semiconductor substrate, which includes at least one signal processing circuit configured to process an input signal that is based on the generated signal charge, are laminated, includes a pad configured to receive a power supply voltage as input from an outside of the photoelectric conversion apparatus, a first protection circuit provided on the first semiconductor substrate, and a second protection circuit provided on the second semiconductor substrate, wherein at least one of the first protection circuit or the second protection circuit is provided on an outside of a region in which the pad is provided, in planar view, and wherein at least one of the first protection circuit or the second protection circuit is connected to the pad.

Further features of the present disclosure will become apparent from the following description of exemplary embodiments with reference to the attached drawings.

BRIEF DESCRIPTION OF THE DRAWINGS

FIG. 8 is a cross-sectional schematic diagram according to the second exemplary embodiment.
FIGS. 23A and 23B are planar layout diagrams according to the seventh exemplary embodiment.

DESCRIPTION OF THE EMBODIMENTS

The operation reliability of a photoelectric conversion apparatus may degrade if an electrostatic noise gets mixed into a signal generated by a photoelectric conversion apparatus or an internal circuit is damaged. The following disclosure relates to techniques for enhancing the operation reliability of a photoelectric conversion apparatus.

Hereinafter, exemplary embodiments will be described with reference to the drawings.

In the following exemplary embodiments, an imaging apparatus will be mainly described as an example of a photoelectric conversion apparatus. However, photoelectric conversion apparatuses according to the exemplary embodiments are not limited to an imaging apparatus, and the exemplary embodiments can also be applied to other types of photoelectric conversion apparatus. For example, the exemplary embodiments can be applied to a distance measuring apparatus (an apparatus for distance measurement that uses focus detection or time of flight (TOF)) or a photometric apparatus (an apparatus for measurement of an incident light amount).

In addition, conductivity types of semiconductor regions and wells, and dopants to be implanted, which will be described in the following exemplary embodiments, are mere examples. The conductivity types and the dopants are not limited to those described in the exemplary embodiments. The conductivity types and the dopants can be appropriately changed from those described in the exemplary embodiments, and with the change, the potentials of the semiconductor regions and wells are appropriately changed.

The conductivity type of a transistor to be described in the following exemplary embodiments is a mere example, and the conductivity type is not limited to the conductivity type described in the exemplary embodiments. The conductivity type can be appropriately changed from the conductivity type described in the exemplary embodiments, and with the change, the potentials of the gate, source, and drain of the transistor are appropriately changed.

For example, in the case of a transistor to be operated as a switch, with the change of the conductivity type, the low-level and high-level potentials to be supplied to the gate, which are described in the exemplary embodiments, are to be reversed. In addition, the conductivity type of a semiconductor region to be described in the following exemplary embodiments is a mere example, and the conductivity type is not limited to the conductivity type described in the exemplary embodiments. The conductivity type can be appropriately changed from the conductivity type described in the exemplary embodiments, and with the change, the potential of the semiconductor region is appropriately changed.

Hereinafter, a structure of a photoelectric conversion apparatus according to a first exemplary embodiment of the present disclosure will be described with reference to FIGS. 1 to 5.

Figure 1:
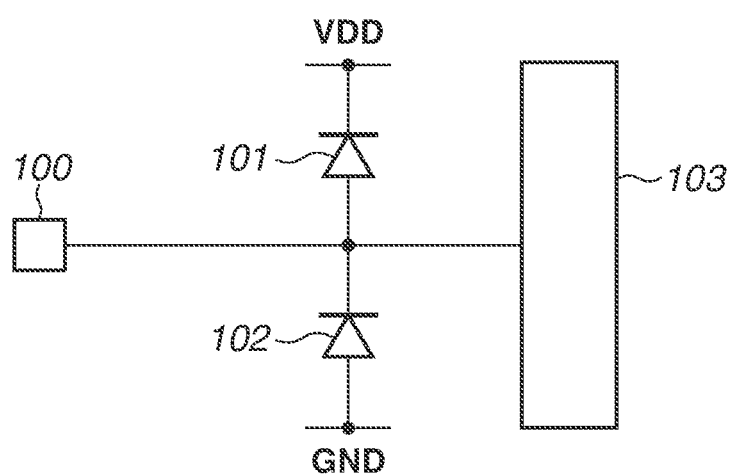
FIG. 1 is an equivalent circuit diagram according to a first exemplary embodiment.

FIG. 1 is an equivalent circuit diagram of an electrostatic protection circuit according to the present exemplary embodiment. Diodes 101 and 102 are connected to an internal circuit 103. The diodes 101 and 102 are also connected to a pad 100.

A cathode of the diode 101 is connected to a power supply voltage node VDD. An anode of the diode 101 and a cathode of the diode 102 are connected to the pad 100 and the internal circuit 103. An anode of the diode 102 is connected to a power supply voltage node GND. Typically, the potential of the power supply voltage node GND is a ground potential. Typically, the potential of the power supply voltage node VDD is a positive potential.

The internal circuit 103 includes, for example, a driver circuit for amplifying a signal input from the outside. The internal circuit 103 may also include a circuit other than the driver circuit. In addition, a circuit element such as a resistive element or a capacitive element may be included in addition to the circuit elements illustrated in FIG. 1.

In the configuration illustrated in FIG. 1, if a power supply voltage VDD is applied to the pad 100, a current does not flow to the diode 101 or the diode 102. On the other hand, if a positive voltage larger than the potential of the power supply voltage node VDD is applied to the pad 100 due to an electrostatic discharge, a current flows to the power supply voltage node VDD via the diode 101. If a negative voltage is applied to the pad 100, a current flows to the power supply voltage node GND via the diode 102. With this operation, the breakdown of the internal circuit 103 can be suppressed even if an electrostatic discharge is applied to the pad 100.

Figure 2A:
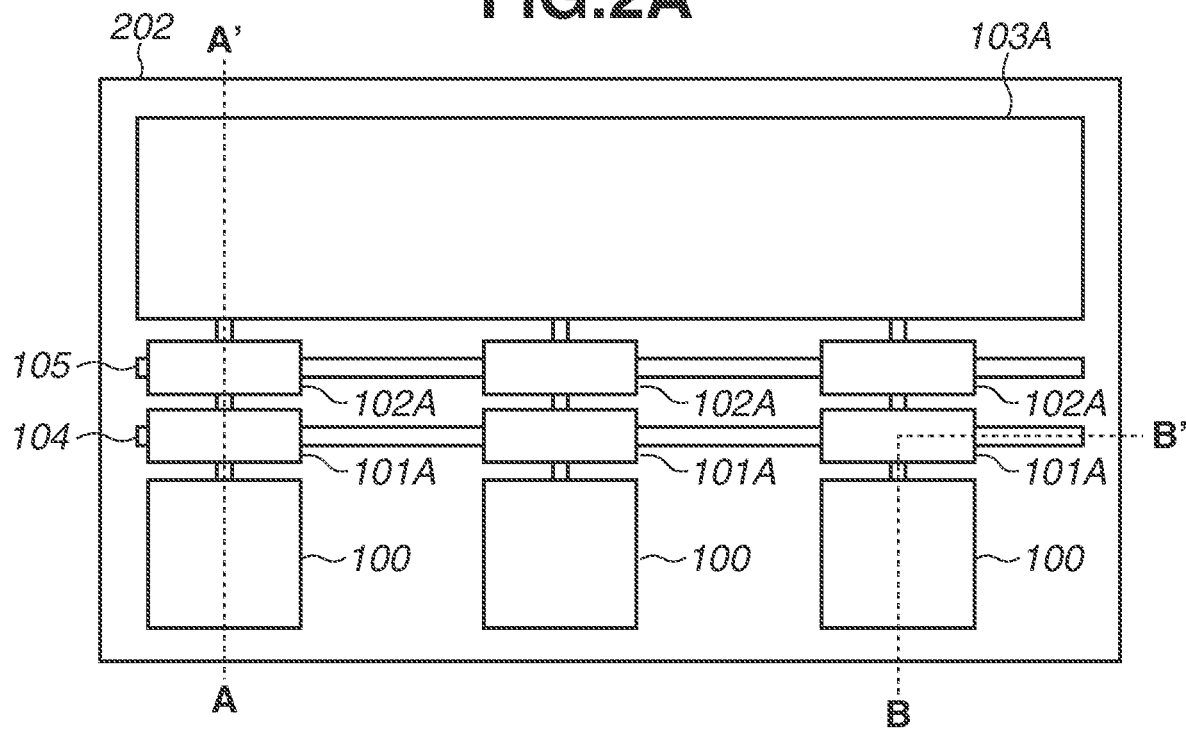
FIGS. 2A and 2B are planar layout diagrams according to the first exemplary embodiment.
Figure 2B:
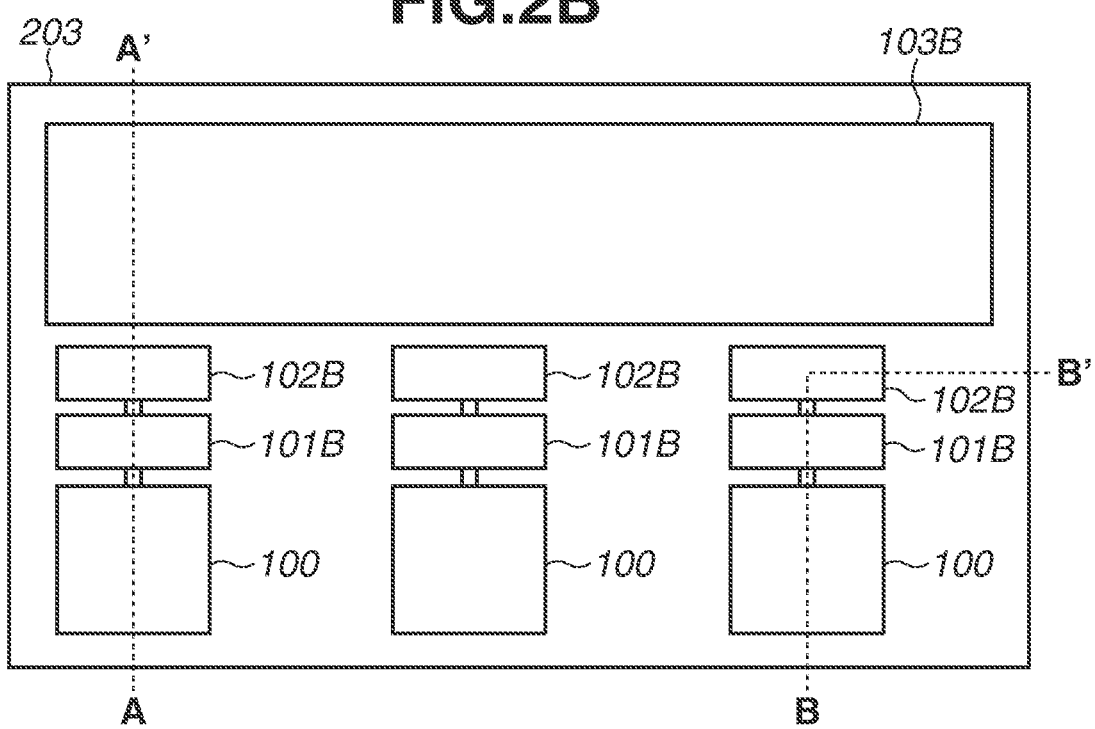

FIGS. 2A and 2B and FIGS. 3A and 3B are planar layout diagrams of the electrostatic protection circuit according to the present exemplary embodiment. In FIGS. 2A, 2B, 3A, and 3B, members having the same functions as the members illustrated in FIG. 1 are assigned the same reference numerals. In the photoelectric conversion apparatus according to the present exemplary embodiment, a first member 202 illustrated in FIG. 2A and a second member 203 illustrated in FIG. 2B are bonded together. The first member 202 and the second member 203 are chips each typically including a semiconductor substrate and at least one wiring layer. In FIGS. 2A and 2B, part of the circuit elements illustrated in FIG. 1 is arranged in both the first member 202 and the second member 203 in a distributed manner. For example, by the combination of diodes 101A and 101B respectively illustrated in FIGS. 2A and 2B, the diode 101 illustrated in FIG. 1 is formed. Similarly, by the combination of diodes 102A and diode 102B respectively illustrated in FIGS. 2A and 2B, the diode 102 illustrated in FIG. 1 is formed. Regarding the pads 100 illustrated in FIGS. 2A and 2B, the pads 100 in one of the first member 202 and the second member 203 may be openings and the pads 100 may be provided only in the other member. Alternatively, the pads 100 may be provided in both the first member 202 and the second member 203. In this case, the pads 100 in one of the first member 202 and the second member 203 are connected to the outside, and the pads 100 in the other member are connected via a via plug to the pads 100 in the mating member to be bonded thereto.

The first member 202 and the second member 203 are bonded in such a manner that the corresponding pads 100 of the first member 202 and the second member 203 overlap in planar view. The pads 100 are arranged in plural numbers in the photoelectric conversion apparatus. The plurality of pads 100 includes a pad (an output pad) for outputting a signal generated by the internal circuit 103, and a pad (an input pad) to which a voltage for driving the internal circuit 103 is input.

In the layouts illustrated in FIGS. 2A and 2B, a partial region of an internal circuit 103A, the diode 101A, the diode 102A, and the pad 100 are arranged on a straight line. From another perspective, it can be said that the diodes 101A, the diodes 102A, and the pads 100 are arranged along the direction intersecting with the direction connecting the diode 101A and the internal circuit 103A. A partial region of an internal circuit 103B, the diode 101B, the diode 102B, and the pad 100 are arranged on a straight line. From another perspective, it can be said that the diodes 101B, the diodes 102B, and the pads 100 are arranged along the direction intersecting with the direction connecting the diode 101B and the internal circuit 103B.

Figure 3A:
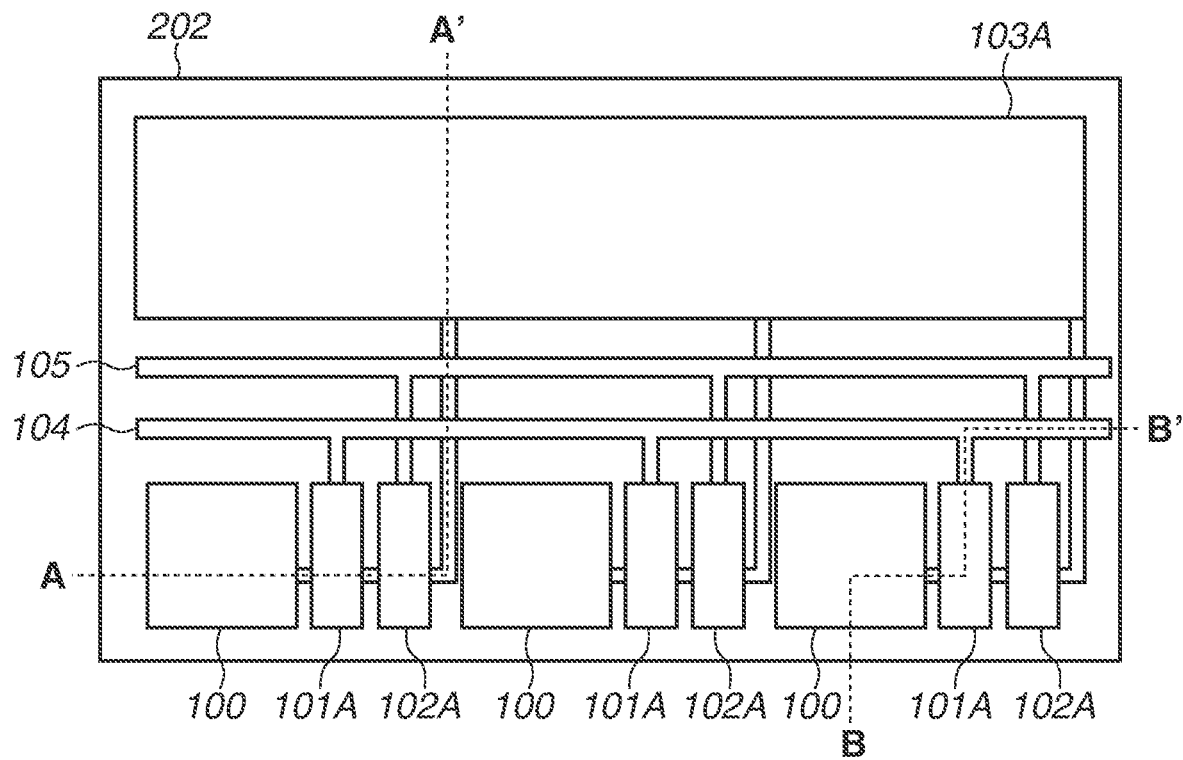
FIGS. 3A and 3B are planar layout diagrams according to the first exemplary embodiment.
Figure 3B:
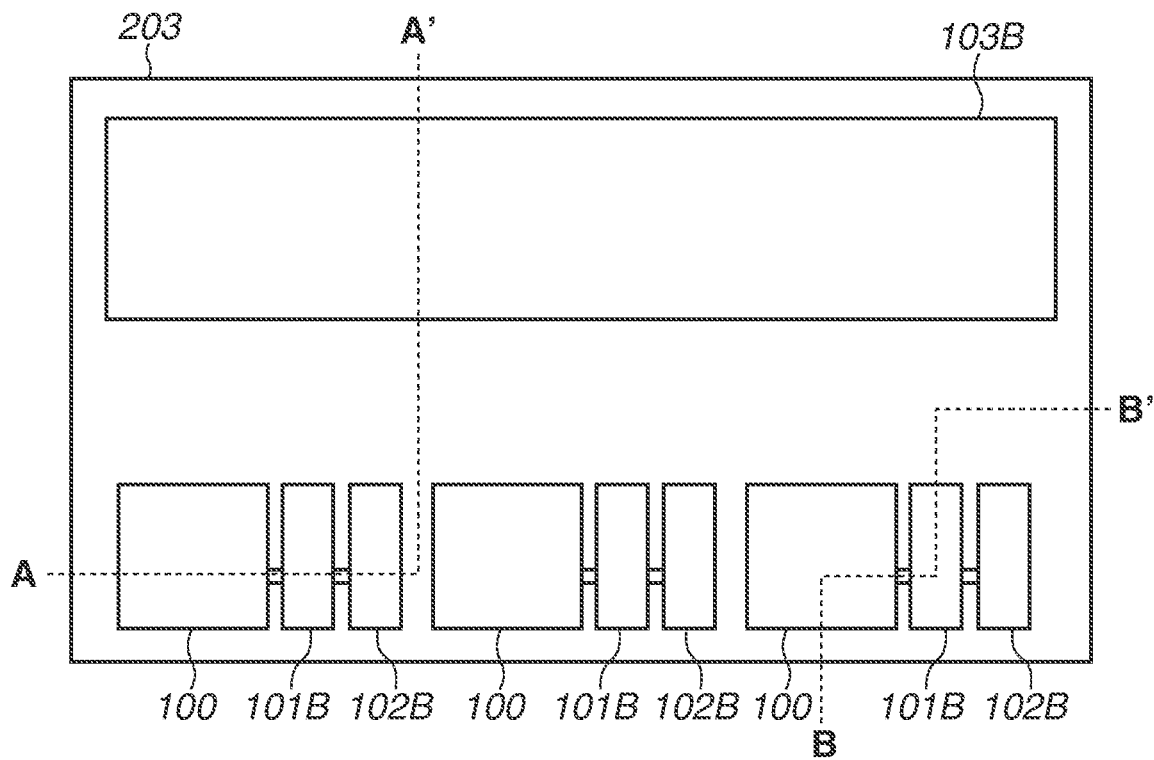

In the layouts illustrated in FIGS. 3A and 3B, the diode 101A, the diode 102A, and the pad 100 are arranged along the direction intersecting with the direction connecting the diode 101A and the internal circuit 103A.

In each of the layout illustrated in FIGS. 2A and 2B and the layout illustrated in FIGS. 3A and 3B, the pad 100, the diodes 101A and 102A, the internal circuit 103A, a VDD power supply wiring line 104, and a GND wiring line 105 are formed in the first member 202. The pad 100, the diodes 101B and 102B, and the internal circuit 103B are formed in the second member 203. In the present exemplary embodiment, the VDD power supply wiring line 104 and the GND wiring line 105 are arranged in the first member 202. As another example, the VDD power supply wiring line 104 and the GND wiring line 105 may be arranged in the second member 203. Alternatively, both the VDD power supply wiring line 104 and the GND wiring line 105 may be arranged in each of the first member 202 and the second member 203.

In the layout illustrated in FIGS. 2A and 2B, the diode 101A is arranged at a position closer to the pad 100 than the diode 102A. The diode 101B is arranged at a position closer to the pad 100 than the diode 102B. The arrangement order is not limited thereto. The diode 102A may be arranged at a position closer to the pad 100 than the diode 101A. The diode 102B may be arranged at a position closer to the pad 100 than the diode 101B.

In addition, in the layout illustrated in FIGS. 3A and 3B, the diodes 101A, 101B, 102A, and 102B are arranged between the plurality of pads 100. The arrangement order of the diodes 101A and 101B and the arrangement order of the diodes 102A and 102B in the configuration illustrated in FIGS. 3A and 3B may be reversed.

Figure 4:
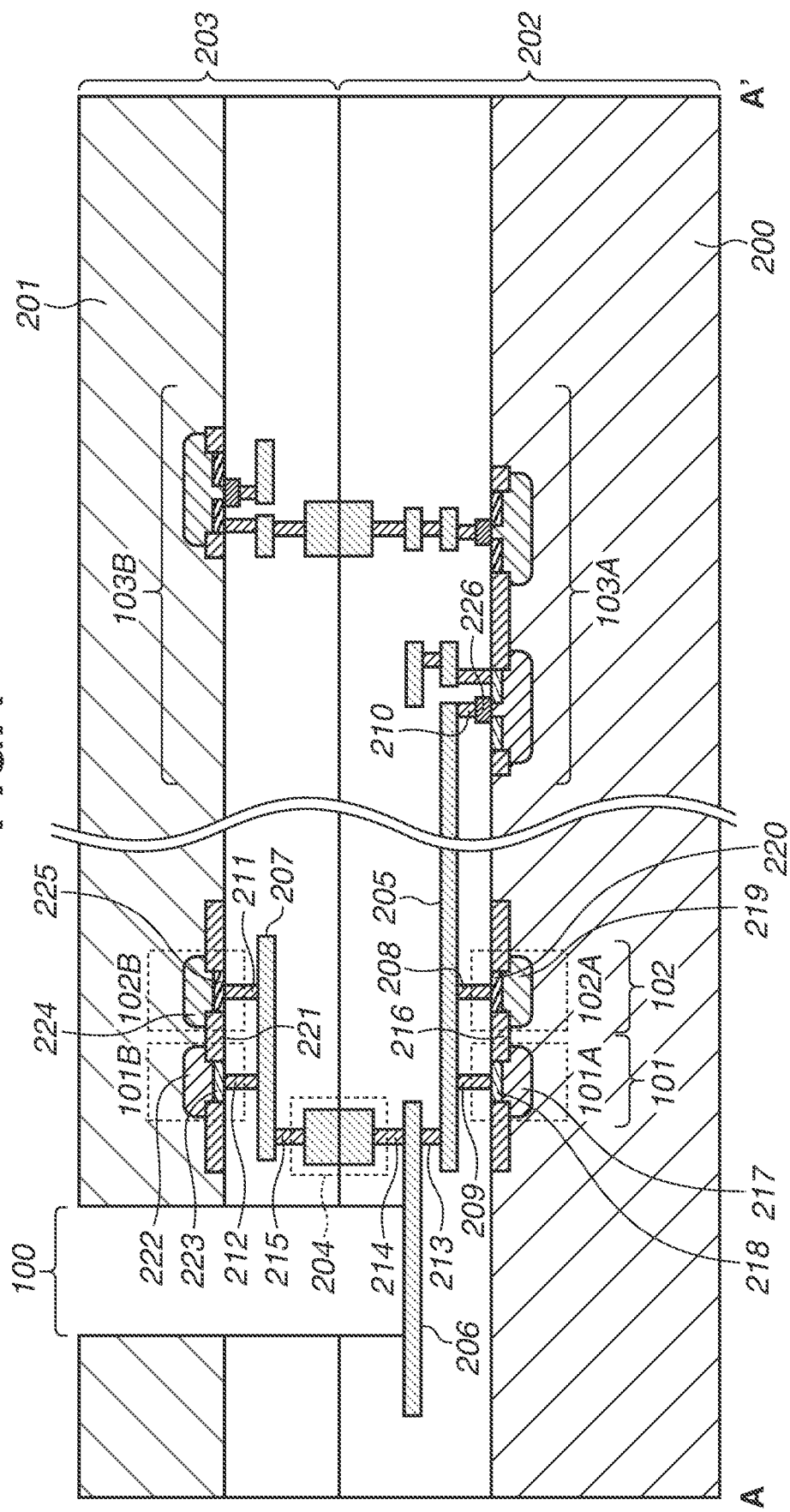
FIG. 4 is a cross-sectional schematic diagram according to the first exemplary embodiment.

FIG. 4 is a cross-sectional diagram of the photoelectric conversion apparatus taken along the broken line A-A' in FIGS. 2A, 2B, 3A, and 3B.

In FIG. 4, members having the same functions as the members illustrated in FIGS. 1 to 3B are assigned the same reference numerals. The first member 202 includes a first substrate 200 and wiring layers. The second member 203 includes a second substrate 201 and a wiring layer. The first substrate 200 and the second substrate 201 are silicon semiconductor substrates, for example. In each of the first substrate 200 and the second substrate 201, circuit elements such as a MOS transistor, a resistive element, a capacitive element, and a photodiode that constitute the internal circuit 103 are formed. The first member 202 and the second member 203 are electrically connected to each other at a bonding portion 204. In addition, the first member 202 includes wiring layers 205 and 206, and contact layers 208, 209, 210, 213, and 214 including a plurality of contacts or vias. Similarly, the second member 203 includes a wiring layer 207, and contact layers 211, 212, and 215 including a plurality of contacts or vias.

The bonding portion 204, the wiring layers 205 to 207, and the contact layers 208 to 215 are formed of metal material such as copper, aluminum, tungsten, or titanium. An interlayer insulating film is formed between the wiring layers, and is formed of any of a silicon oxide film, a silicon nitride film, and a silicon carbonized film, or a combination of any of the plurality of types of films, for example. The number of wiring layers included in each of the first member 202 and the second member 203 can be optionally set. In the present exemplary embodiment, the number of wiring layers included in the first member 202 is two, and the number of wiring layers included in the second member 203 is one.

In addition, in the present exemplary embodiment, the diodes 101A and 102A are formed in the first substrate 200, and the diodes 101B and 102B are formed in the second substrate 201. The diode 101A is an element constituting a part of the diode 101, and the anode region thereof is illustrated in FIG. 4. The diode 102A is an element constituting a part of the diode 102, and the cathode region thereof is illustrated in FIG. 4. The diode 101B is an element constituting a part of the diode 101, and the anode region thereof is illustrated in FIG. 4. The diode 102B is an element constituting a part of the diode 102, and the cathode region thereof is illustrated in FIG. 4.

The anode region of the diode 101A is formed by providing a p-type semiconductor region 218 on an n-type semiconductor region 217 formed on the first substrate 200. The anode region of the diode 101B is formed by providing a p-type semiconductor region 223 on an n-type semiconductor region 222 formed on the second substrate 201. The cathode region of the diode 102A is formed by providing an n-type semiconductor region 220 on a p-type semiconductor region 219 formed on the first substrate 200. The cathode region of the diode 102B is formed by providing an n-type semiconductor region 225 on a p-type semiconductor region 224 formed on the second substrate 201. An element isolation region 216 is formed between the diodes 101A and 102A. An element isolation region 221 is formed between the diodes 101B and 102B.

The diode 101A is connected to the pad 100 via the wiring layers 205 and 206 and the contact layers 209 and 213. The diode 102A is connected to the pad 100 via the wiring layers 205 and 206 and the contact layers 208 and 213. The diode 101B is connected to the pad 100 via the wiring layers 206 and 207, the bonding portion 204, and the contact layers 212, 215, and 214. The diode 102B is connected to the pad 100 via the wiring layers 206 and 207, the bonding portion 204, and the contact layers 211, 215, and 214. In addition, the internal circuit 103A is connected to the pad 100 via the wiring layers 205 and 206 and the contact layers 210 and 213. In the present exemplary embodiment, a gate 226 of a MOS transistor is connected to the contact layer 210. As another example, the contact layer 210 may be connected to a source or drain region of the MOS transistor or a circuit element other than the MOS transistor. In addition, the contact layer 210 may be connected to the internal circuit 103B.

Figure 5:
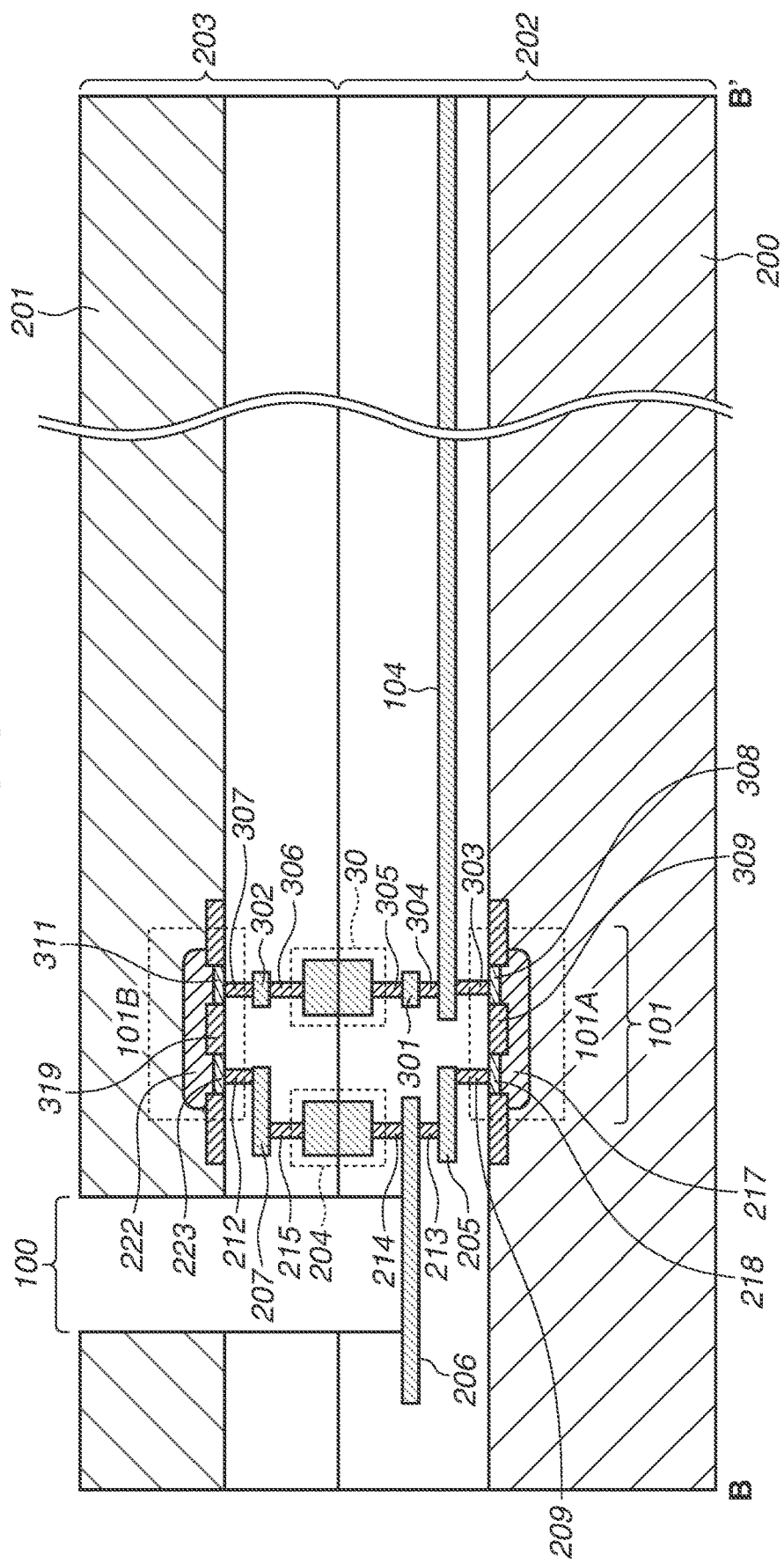
FIG. 5 is a cross-sectional schematic diagram according to the first exemplary embodiment.

FIG. 5 is a cross-sectional schematic diagram of the photoelectric conversion apparatus taken along the broken line B-B' in FIGS. 2A, 2B, 3A, and 3B. As illustrated in FIG. 4, the anode region of the diode 101A is connected to the pad 100 via the wiring layers 205 and 206 and the contact layers 209 and 213. A cathode region of the diode 101A is formed by providing an n-type semiconductor region 308 on the n-type semiconductor region 217. The cathode region of the diode 101A is connected to the VDD power supply wiring line 104 via a contact layer 303. The anode region of the diode 101B is connected to the pad 100 via the wiring layers 206 and 207, the bonding portion 204, and the contact layers 212, 215, and 214. The diodes 101 and 102 overlap the wiring line of the wiring layer 205 in planar view.

In a cathode region of the diode 101B, an n-type semiconductor region 311 is formed on the n-type semiconductor region 222. The cathode region of the diode 101B is connected to the VDD power supply wiring line 104 via wiring layers 301 and 302, contact layers 304 to 307, and a bonding portion 30. In the present exemplary embodiment, the n-type semiconductor regions 308 and 311 are formed in the cathode regions of the diodes 101A and 101B, respectively. As another example, contact layers may be connected to the n-type semiconductor regions 217 and 222 instead of the p-type semiconductor regions 218 and 223. In addition, in the present exemplary embodiment, element isolation regions 309 and 319 are formed to separate the n-type semiconductor region and the p-type semiconductor region. The separation method is not limited thereto. A p-n bonded isolation region in which the n-type semiconductor region and the p-type semiconductor region are bonded may be formed instead of forming the element isolation regions 309 and 319. In addition, a structure such as a silicide structure, which is not illustrated in FIG. 5, may be provided on the first substrate 200 or the second substrate 201.

In the photoelectric conversion apparatus according to the present exemplary embodiment, an electrostatic protection circuit is arranged on each of two laminated semiconductor substrates. With this configuration, the photoelectric conversion apparatus according to the present exemplary embodiment has an advantageous effect of increasing the electrostatic protection circuit area while suppressing the increase of the chip area, as compared with a case where an electrostatic protection circuit is arranged on only one of the two substrates. In addition, in the present exemplary embodiment, the electrostatic protection circuit is arranged in a region not overlapping the pad 100 in planar view. Thus, it is possible to make the electrostatic protection circuit less likely to receive a pressure generated by wire connection to the pad 100, and suppress the occurrence of a malfunction of the electrostatic protection circuit.

While in the present exemplary embodiment, a laminated structure with two semiconductor substrates has been described, a larger number of semiconductor substrates may be laminated.

Hereinafter, a photoelectric conversion apparatus according to a second exemplary embodiment of the present disclosure will be described with reference to FIGS. 6A to 9. In the following description, differences from the first exemplary embodiment will be mainly described, and parts similar to the first exemplary embodiment may be omitted.

An equivalent circuit of an electrostatic protection circuit according to the present exemplary embodiment can be the same as the equivalent circuit described in the first exemplary embodiment with reference to FIG. 1. FIGS. 6A and 6B and FIGS. 7A and 7B are planar layout diagrams of the electrostatic protection circuit according to the present exemplary embodiment. In FIGS. 6A, 6B, 7A, and 7B, members having the same functions as the members described with reference to FIGS. 1 to 5 are assigned the same reference numerals as the reference numerals assigned in FIGS. 1 to 5.

Figure 6A:
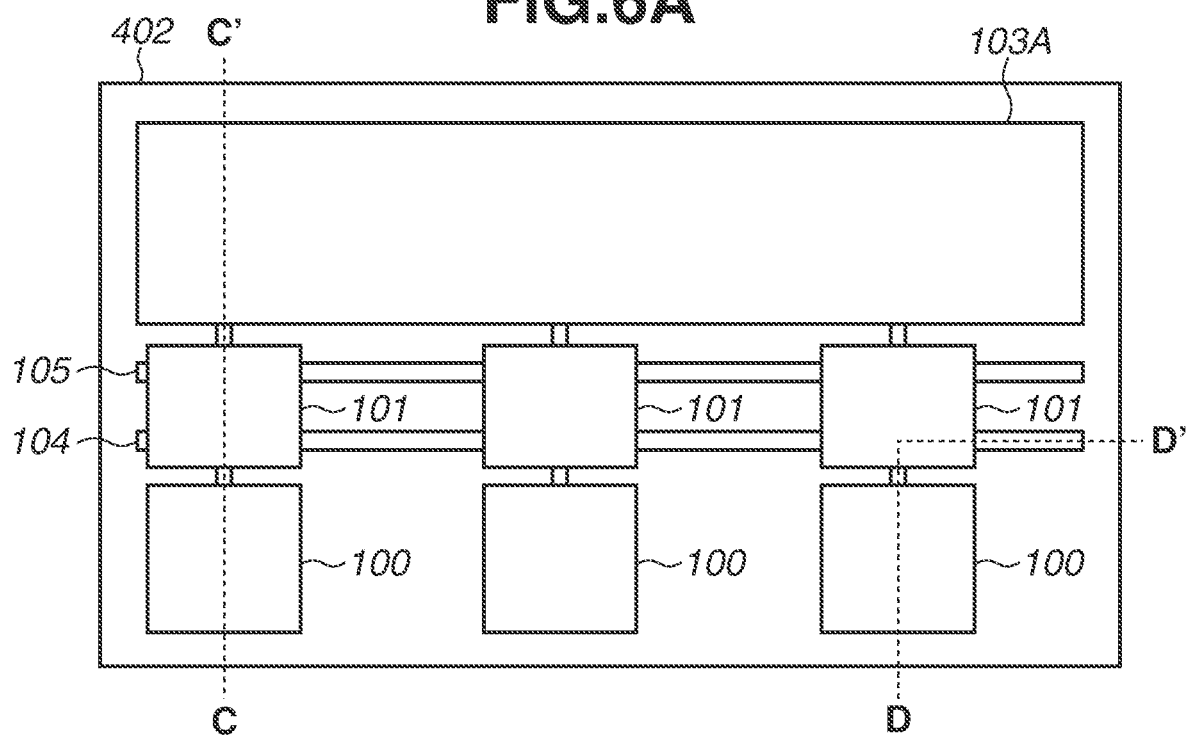
FIGS. 6A and 6B are planar layout diagrams according to a second exemplary embodiment.
Figure 6B:
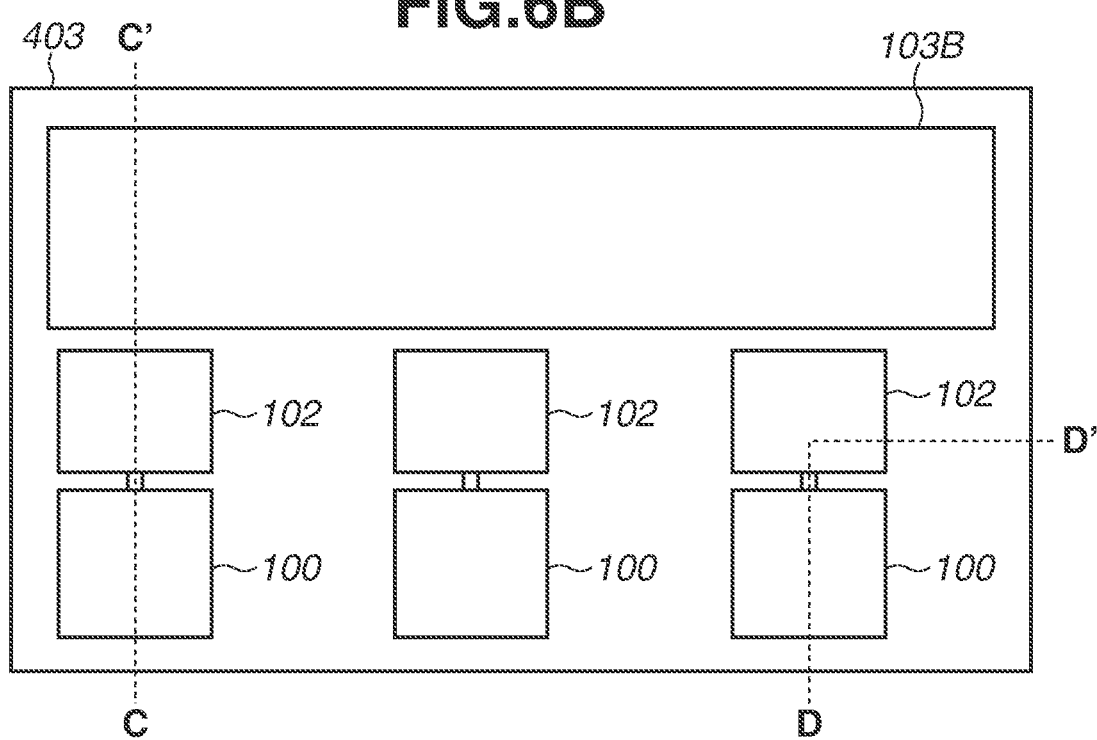
Figure 7A:
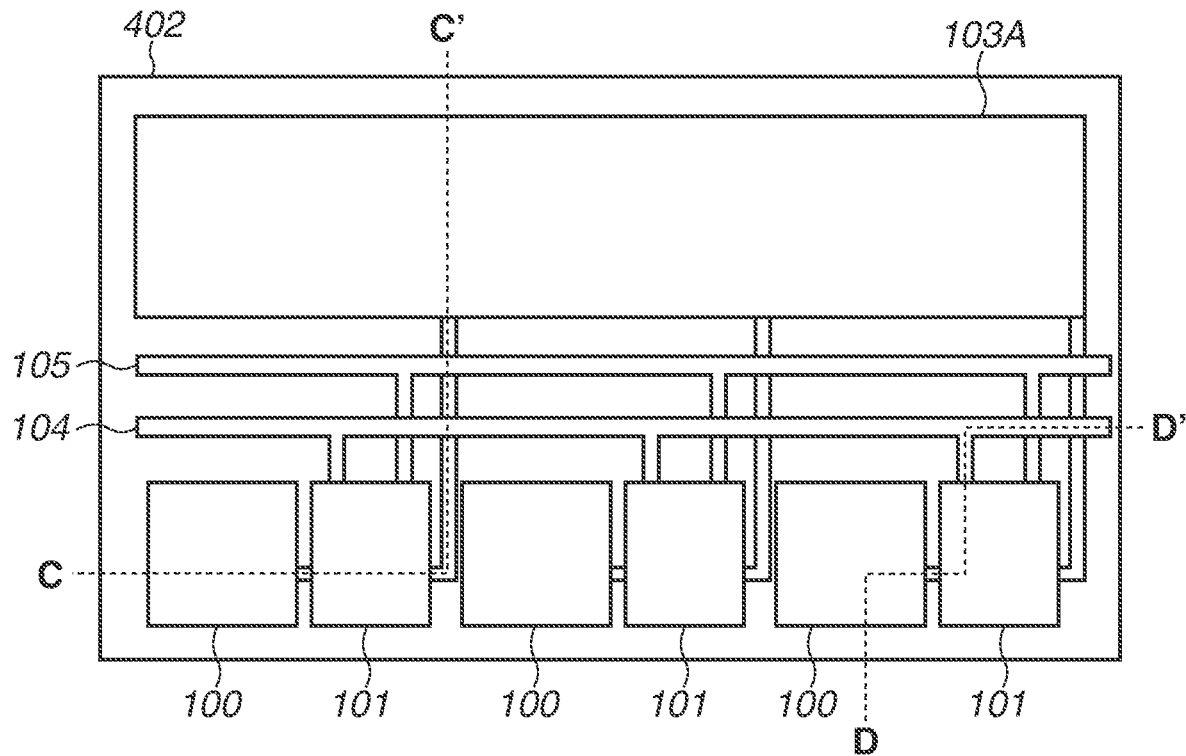
FIGS. 7A and 7B are planar layout diagrams according to the second exemplary embodiment.
Figure 7B:
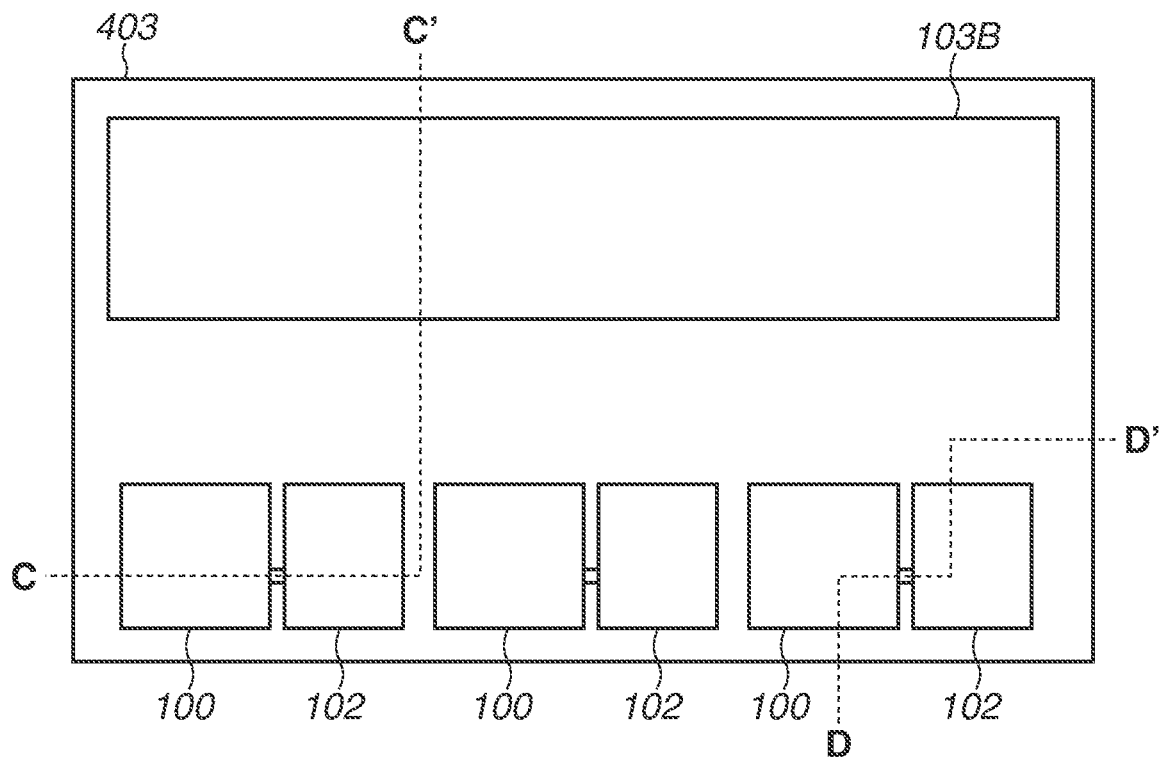

In the present exemplary embodiment, the photoelectric conversion apparatus is formed by bonding a first member 402 illustrated in FIG. 6A and a second member 403 illustrated in FIG. 6B. Similarly to the first exemplary embodiment, the first member 402 illustrated in FIG. 6A and the second member 403 illustrated in FIG. 6B are bonded in such a manner that the corresponding pads 100 overlap in planar view.

Also in FIGS. 6A and 6B and FIGS. 7A and 7B, the pad 100, the diode 101, the internal circuit 103A, the VDD power supply wiring line 104, and the GND wiring line 105 are formed in the first member 402. The pad 100, the diode 102, and the internal circuit 103B are formed in the second member 403. In the present exemplary embodiment, the VDD power supply wiring line 104 and the GND wiring line 105 are arranged in the first member 402. Alternatively, the VDD power supply wiring line 104 and the GND wiring line 105 may be arranged in the second member 403. In addition, both the VDD power supply wiring line 104 and the GND wiring line 105 may be arranged in each of the first member 402 and the second member 403.

In the planar layout diagrams illustrated in FIGS. 6A and 6B, the diode 101 and 102 are arranged between the pad 100 and the internal circuit 103A and 103B, respectively. In the planar layout diagrams illustrated in FIGS. 7A and 7B, the diodes 101 and 102 are arranged between the pads 100.

FIG. 8 is a cross-sectional schematic diagram of the photoelectric conversion apparatus taken along the broken line C-C' in FIGS. 6A, 6B, 7A, and 7B. In FIG. 8, members having the same functions as the members described with reference to FIGS. 1 to 7B are assigned the same reference numerals as the reference numerals assigned in FIGS. 1 to 7B. In the photoelectric conversion apparatus according to the present exemplary embodiment, the first member 402 including a first substrate 400 and the second member 403 including a second substrate 401 are bonded together. The first member 402 and the second member 403 are electrically connected to each other at a bonding portion 404. The first member 402 includes wiring layers 405 and 406 and contact layers 408, 409, 411, and 412. The second member 403 includes a wiring layer 407 and contact layers 410 and 413.

In the present exemplary embodiment, the diode 101 is formed on the first substrate 400 and the diode 102 is formed on the second substrate 401, but the arrangement positions may be made opposite. FIG. 8 illustrates an anode region of the diode 101 and a cathode region of the diode 102. In the anode region of the diode 101, a p-type semiconductor region 415 is formed on an n-type semiconductor region 414 formed on the first substrate 400. In the cathode region of the diode 102, an n-type semiconductor region 417 is formed on a p-type semiconductor region 416 formed on the second substrate 401. Element isolating regions 418 are provided adjacent to the n-type semiconductor region 414. The element isolating regions 418 are formed as a shallow-trench isolation (STI), in one embodiment. The element isolating regions 418 may be formed by a local oxidation of silicon (LOCOS) process or a deep trench isolation process.

The diode 101 is connected to the pad 100 via the wiring layers 405 and 406 and the contact layers 408 and 411. The diode 102 is connected to the pad 100 via the wiring layers 407 and 406, the bonding portion 404, and the contact layers 410, 412, and 413. The internal circuit 103A is connected to the pad 100 via the wiring layers 405 and 406 and the contact layers 409 and 411. The contact layer 409 connects to a gate electrode 419 of a transistor.

Figure 9:
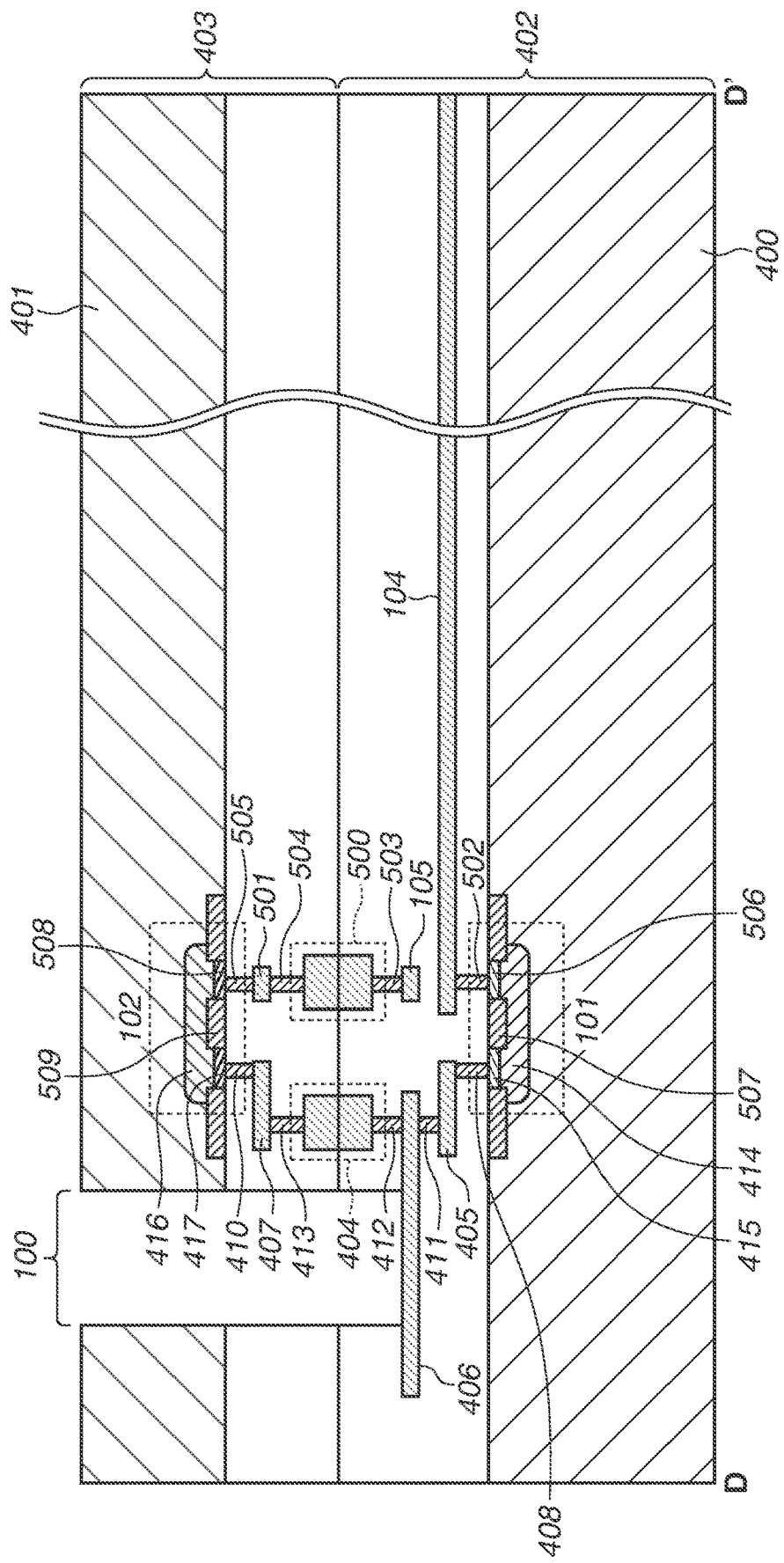
FIG. 9 is a cross-sectional schematic diagram according to the second exemplary embodiment.

FIG. 9 is a cross-sectional schematic diagram of the photoelectric conversion apparatus taken along the broken line D-D' in FIGS. 6A, 6B, 7A, and 7B. A cathode region of the diode 101 is formed by providing an n-type semiconductor region 506 on the n-type semiconductor region 414. The cathode region is connected to the VDD power supply wiring line 104 via a contact layer 502. An anode region of the diode 102 is formed by providing a p-type semiconductor region 508 on the p-type semiconductor region 416. The anode region is connected to the GND wiring line 105 via a wiring layer 501, contact layers 503, 504, and 505, and a bonding portion 500. An element isolating region 507 is provided adjacent to the n-type semiconductor region 414. An element isolating region 509 is provided adjacent to the n-type semiconductor region 417. The element isolating regions 507 and 509 are formed as a shallow-trench isolation (STI). The element isolating regions 507 and 509 may be formed by a LOCOS process or a deep trench isolation process.

In the photoelectric conversion apparatus according to the present exemplary embodiment, the diode 101 is arranged on one of the two laminated substrates and the diode 102 is arranged on the other laminated substrate. With this configuration, the element isolation regions 216 and 221 illustrated in FIG. 4, for example, can be omitted in the present exemplary embodiment. Thus, circuit areas allocated to the element isolation regions 216 and 221 in the first exemplary embodiment can be allocated to the electrostatic protection circuit. Accordingly, the photoelectric conversion apparatus according to the present exemplary embodiment has an effect of further increasing the circuit area of the electrostatic protection circuit.

Hereinafter, a structure of a photoelectric conversion apparatus according to a third exemplary embodiment will be described with reference to FIGS. 10A to 11. An equivalent circuit diagram of an electrostatic protection circuit according to the third exemplary embodiment is similar to that in FIG. 1.

Figure 10A:
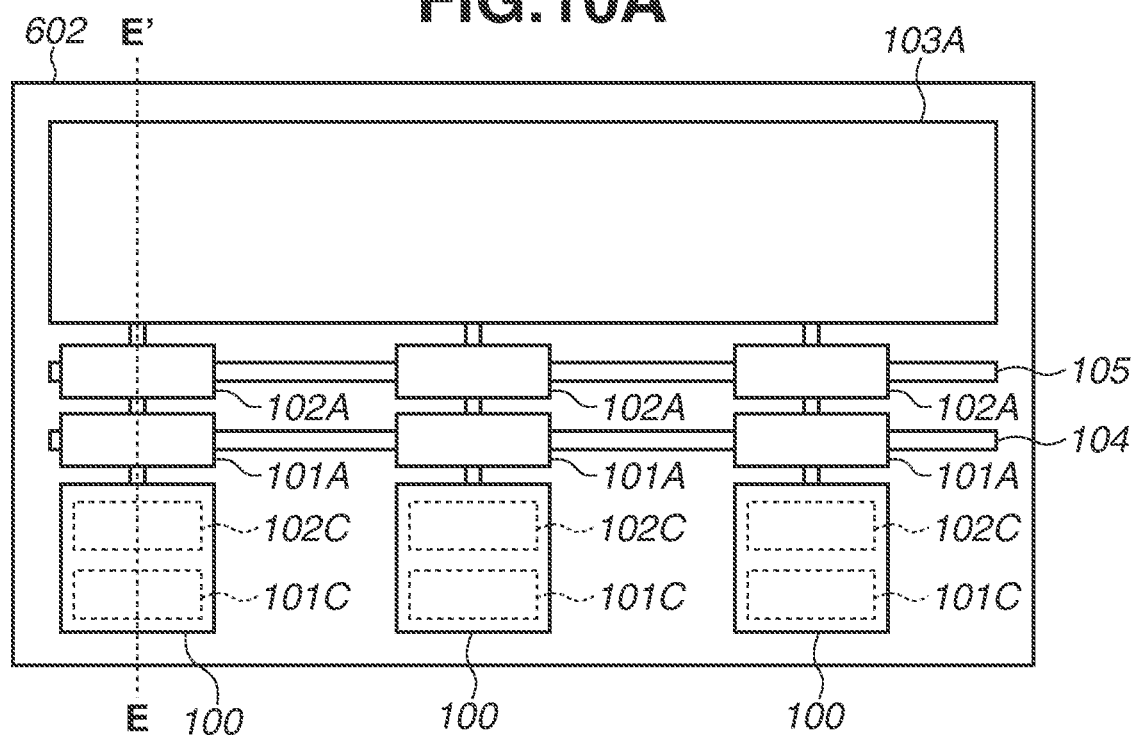
FIGS. 10A and 10B are planar layout diagrams according to a third exemplary embodiment.
Figure 10B:
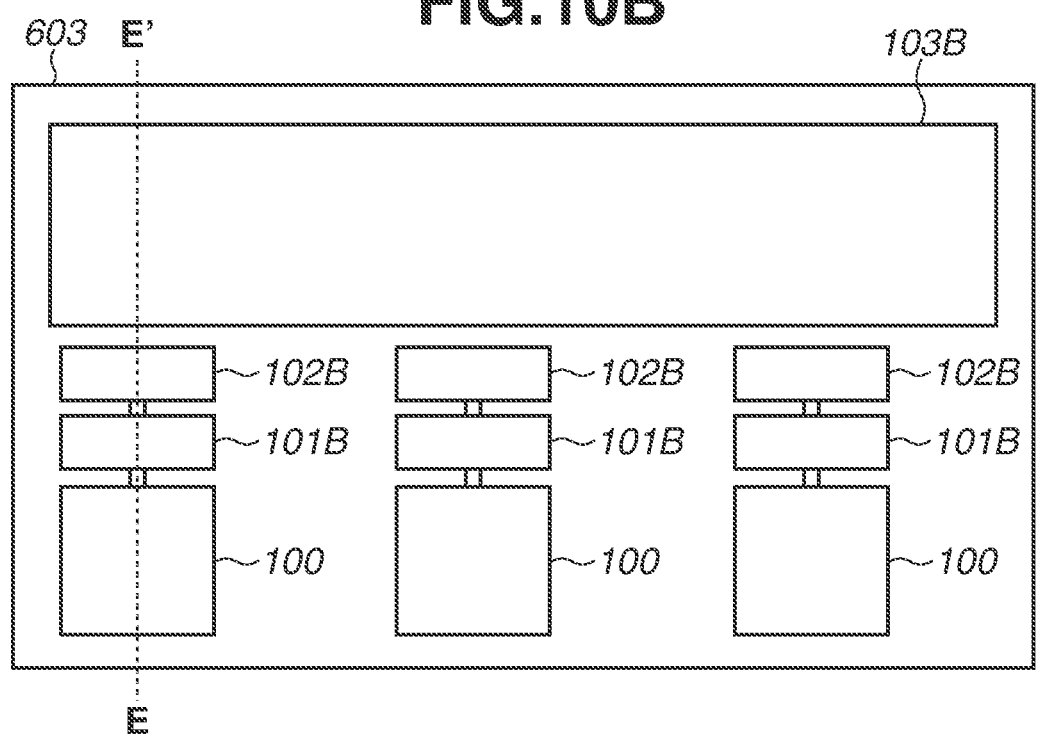

FIGS. 10A and 10B are planar layout diagrams of the electrostatic protection circuit according to the third exemplary embodiment. The same components as those illustrated in FIGS. 1 to 9 are assigned the same reference numerals, and the description thereof will be omitted. In FIGS. 10A and 10B, the arrangement of the pad 100, the diodes 101A, 101B, 102A, and 102B, the internal circuits 103A and 103B, the VDD power supply wiring line 104, and the GND wiring line 105 is similar to the arrangement illustrated in FIGS. 2A and 2B. As another example, arrangement similar to the arrangement illustrated in FIGS. 3A and 3B may be employed. In addition, as illustrated in FIGS. 6A and 6B and FIGS. 7A and 7B, the diodes 101 and 102 may be separately arranged in a first member 602 and a second member 603. Diodes 101C and 102C are part of the diodes 101 and 102, respectively. In the present exemplary embodiment, the diodes 101C and 102C are arranged in the first member 602 and are formed in a region overlapping the pad 100 in planar view. In FIGS. 10A and 10B, the diodes 101C and 102C are arranged at positions overlapping the pad 100 in planar view, but the arrangement is not limited thereto. For example, the diodes 101C and 102C may each partially overlap the pad 100 in planar view, and the other parts of the diodes 101C and 102C may be at positions not overlapping the pad 100.

Figure 11:
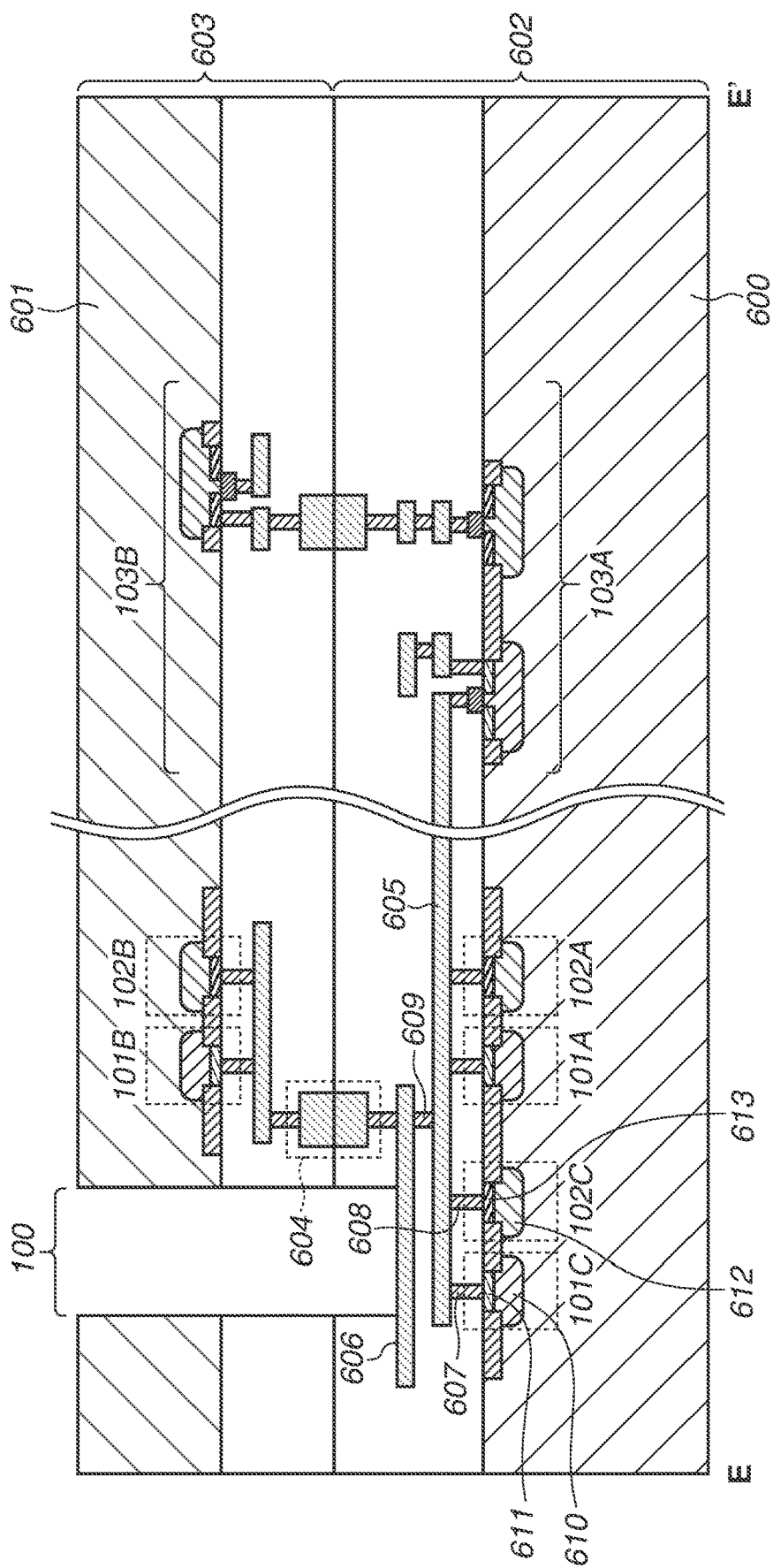
FIG. 11 is a cross-sectional schematic diagram according to the third exemplary embodiment.

FIG. 11 is a cross-sectional schematic diagram of the photoelectric conversion apparatus taken along the broken line E-E' in FIGS. 10A and 10B. In FIG. 11, the same components as those illustrated in FIGS. 1 to 10B are assigned the same reference numerals, and the description thereof will be omitted.

In the photoelectric conversion apparatus according to the third exemplary embodiment, the first member 602 including a first substrate 600 and the second member 603 including a second substrate 601 are bonded together. The first member 602 and the second member 603 are electrically connected to each other at a bonding portion 604. The first member 602 includes wiring layers 605 and 606 and contact layers 607 to 609. The diodes 101A, 102A, 101C, and 102C are formed in the first substrate 600, and the diodes 101B and 102B are formed in the second substrate 601. The structures and the connection relationship of the diodes 101A, 102A, 101B, and 102B are similar to those described with reference to FIG. 4. In an anode region of the diode 101C, a p-type semiconductor region 611 is formed on an n-type semiconductor region 610 formed on the first substrate 600. In a cathode region of the diode 102C, an n-type semiconductor region 613 is formed on a p-type semiconductor region 612 formed on the first substrate 600. The diode 101C is connected to the pad 100 via the wiring layers 605 and 606 and the contact layers 607 and 609. The diode 102C is connected to the pad 100 via the wiring layers 605 and 606 and the contact layers 608 and 609. In this example, the diodes 101C and 102C are arranged in a region overlapping the pad 100 in planar view. In addition, a cathode region of the diode 101C is connected to the VDD power supply wiring line 104 and an anode region of the diode 102C is connected to the GND wiring line 105, which is not illustrated in FIG. 11.

In the structure according to the present exemplary embodiment, the diodes 101C and 102C are arranged in a region overlapping the pad 100, in addition to the structure according to the first exemplary embodiment. With this configuration, the electrostatic protection circuit area can be further increased. The diodes 101C and 102C may change in characteristics or electrostatic resistance due to the pressure received when wire bonding is formed on the pad 100. However, in the present exemplary embodiment, the diodes 101A, 101B, 102A, and 102B provided at positions not overlapping the pad 100 in planar view are less likely to be affected by the formation of wire bonding. The diodes 101A, 101B, 102A, and 102B can thus stably operate as an electrostatic protection circuit. Thus, in the photoelectric conversion apparatus according to the present exemplary embodiment, the entire electrostatic protection circuit can stably operate.

Hereinafter, a structure of a photoelectric conversion apparatus according to a fourth exemplary embodiment of the present disclosure will be described with reference to FIGS. 12A, 12B, and 13.

An equivalent circuit diagram of an electrostatic protection circuit according to the fourth exemplary embodiment is similar to that in FIG. 1.

Figure 12A:
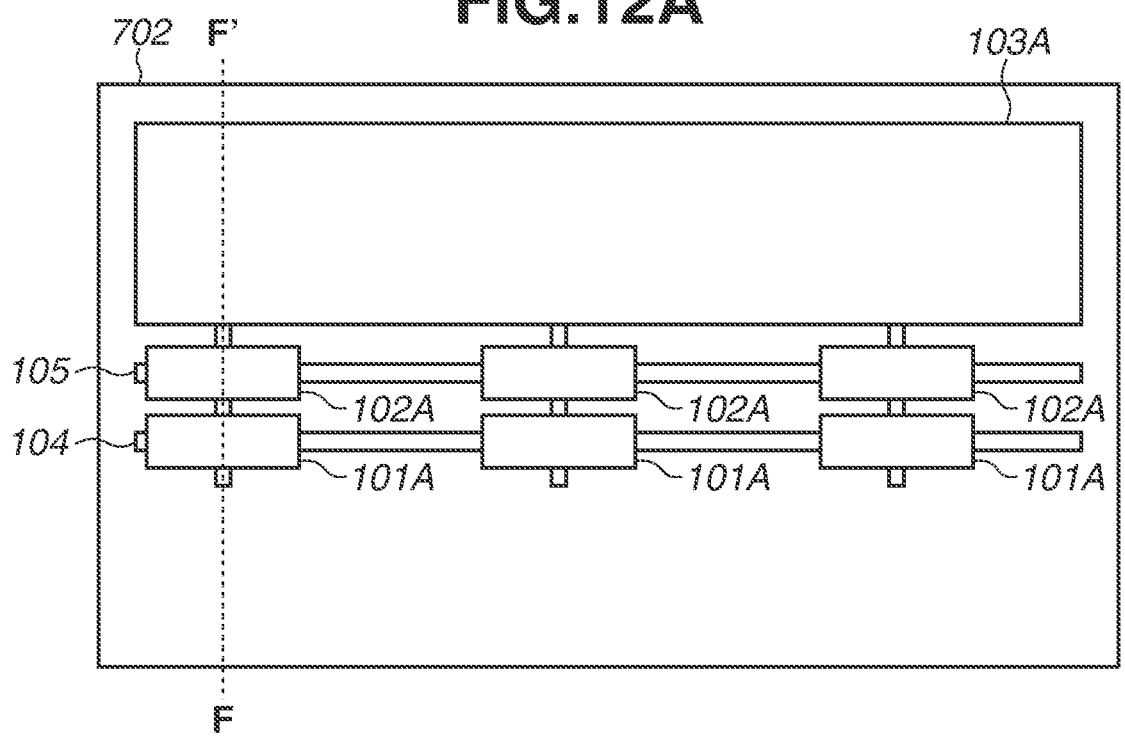
FIGS. 12A and 12B are planar layout diagrams according to a fourth exemplary embodiment.
Figure 12B:
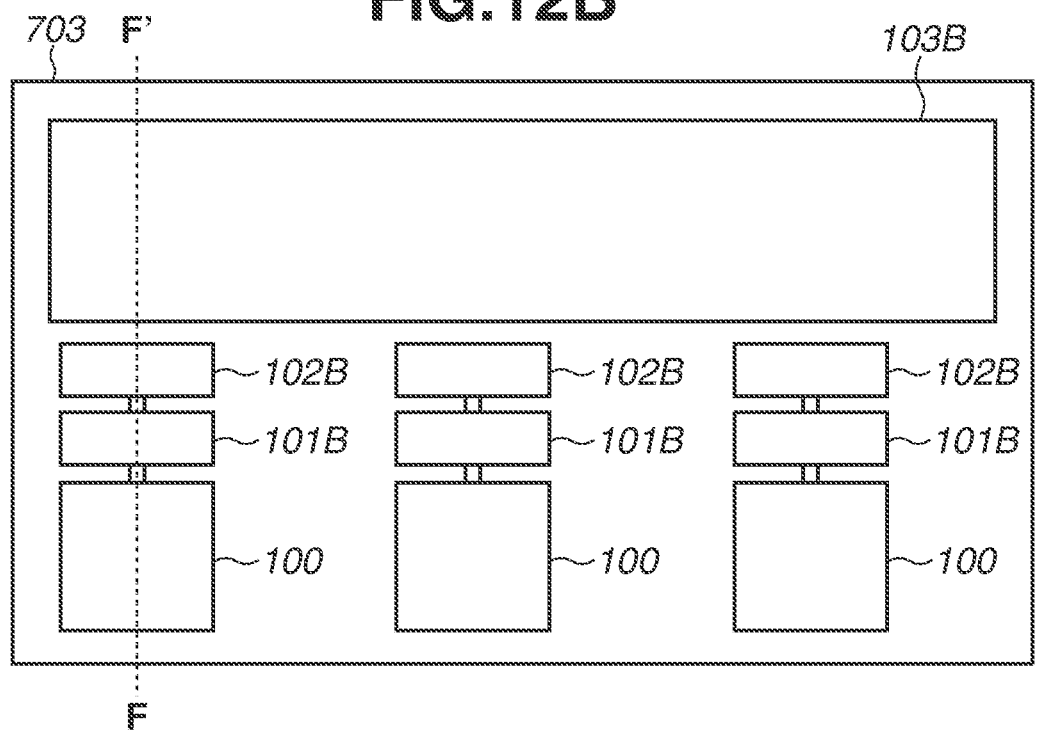

FIGS. 12A and 12B are planar layout diagrams of the electrostatic protection circuit according to the fourth exemplary embodiment. The same components as those illustrated in FIGS. 1 to 11 are assigned the same reference numerals, and the description thereof will be omitted. In the present exemplary embodiment, the pad 100 is formed in a second member 703. An opening for the pad 100 is not formed in a first member 702.

The arrangement of the diodes 101A, 101B, 102A, and 102B, the internal circuits 103A and 103B, the VDD power supply wiring line 104, and the GND wiring line 105 is similar to the arrangement illustrated in FIGS. 2A and 2B, but may be made similar to the arrangement illustrated in FIGS. 3A and 3B. In addition, as illustrated in FIGS. 6A and 6B and FIGS. 7A and 7B, the diodes 101 and 102 may be separately arranged in the first member 702 and the second member 703.

Figure 13:
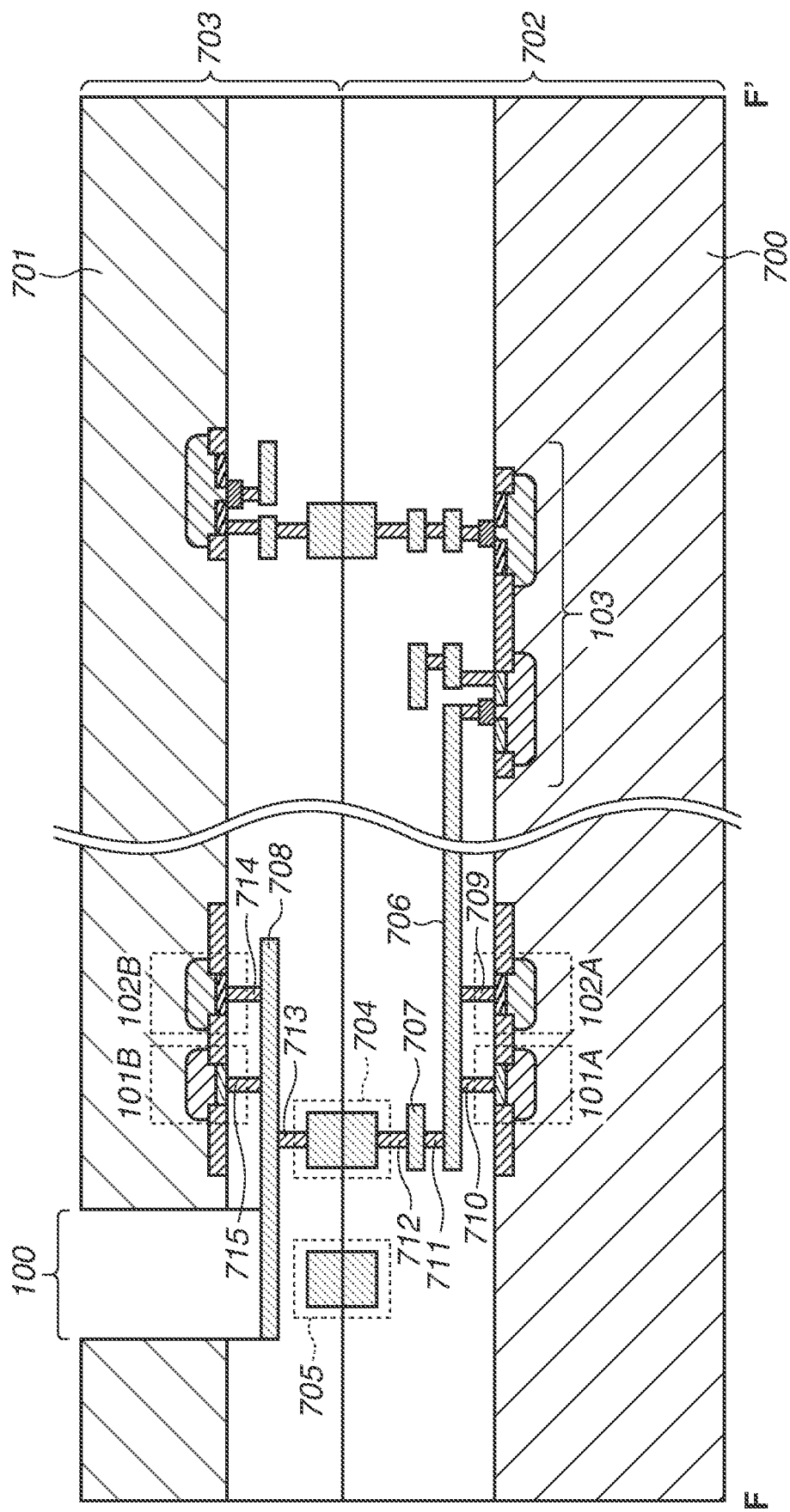
FIG. 13 is a cross-sectional schematic diagram according to the fourth exemplary embodiment.

FIG. 13 is a cross-sectional schematic diagram of the photoelectric conversion apparatus taken along the broken line F-F' in FIGS. 12A and 12B.

In FIG. 13, the same components as those illustrated in FIGS. 1 to 12B are assigned the same reference numerals, and the description thereof will be omitted. In the photoelectric conversion apparatus according to the fourth exemplary embodiment, the first member 702 including a first substrate 700 and the second member 703 including a second substrate 701 are bonded together. The first member 702 and the second member 703 are electrically connected to each other at bonding portions 704 and 705. The first member 702 includes wiring layers 706 and 707 and contact layers 709 to 712, and the second member 703 includes a wiring layer 708 and contact layers 713 to 715. The structures of the diodes 101A, 102A, 101B, and 102B are similar to those illustrated in FIG. 4.

The diode 101A is connected to the pad 100 via the wiring layers 706 to 708, the bonding portion 704, and the contact layers 710 to 713. The diode 102A is connected to the pad 100 via the wiring layers 706 to 708, the bonding portion 704, and the contact layers 709 and 711 to 713. The diode 101B is connected to the pad 100 via the wiring layer 708 and the contact layer 715. The diode 102B is connected to the pad 100 via the wiring layer 708 and the contact layer 714. In addition, the diodes 101A and 101B are connected to the VDD power supply wiring line 104 similarly to the configuration illustrated in FIG. 5. Similarly, the diodes 102A and 102B are connected to the GND wiring line 105.

In the structure according to the present exemplary embodiment, the pad 100 is formed in the second member 703, and the bonding portion 705 can be arranged in a region overlapping the pad 100 in planar view. With this structure, bonding strength of the first member 702 and the second member 703 can be enhanced.

Hereinafter, a structure of a photoelectric conversion apparatus according to a fifth exemplary embodiment of the present disclosure will be described with reference to FIGS. 14 to 17.

Figure 14:
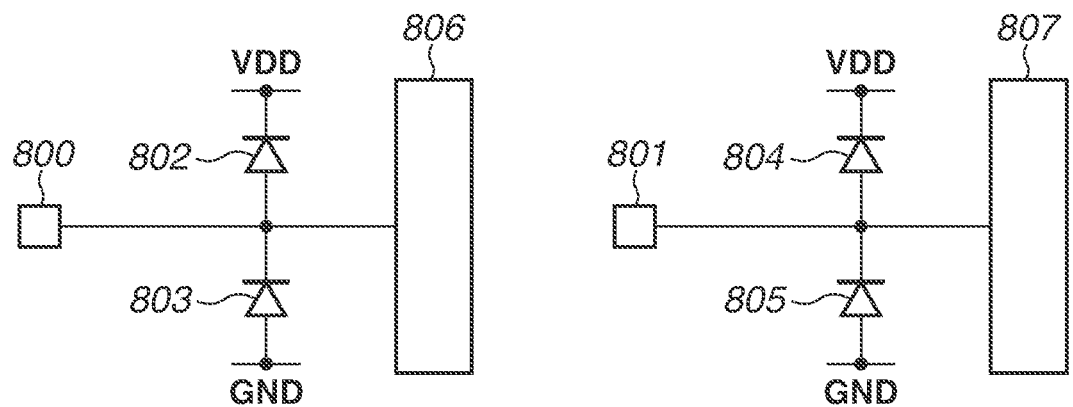
FIG. 14 is an equivalent circuit diagram according to a fifth exemplary embodiment.

FIG. 14 is an equivalent circuit diagram of the photoelectric conversion apparatus according to the fifth exemplary embodiment. The photoelectric conversion apparatus according to the present exemplary embodiment includes pads 800 and 801, diodes 802 to 805, and internal circuits 806 and 807. A first electrostatic protection circuit including the pad 800, the diodes 802 and 803, and the internal circuit 806, and a second electrostatic protection circuit including the pad 801, the diodes 804 and 805, and the internal circuit 807 each have the same configuration as the circuit illustrated in FIG. 1.

Figure 15A:
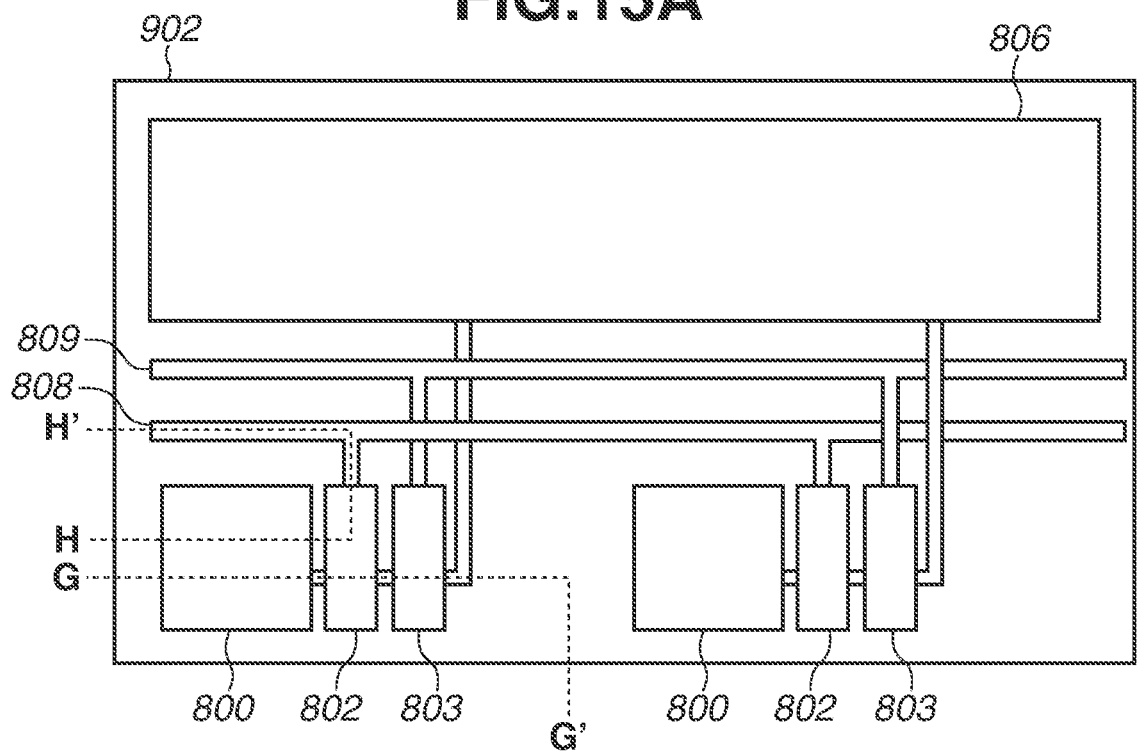
FIGS. 15A and 15B are planar layout diagrams according to the fifth exemplary embodiment.
Figure 15B:
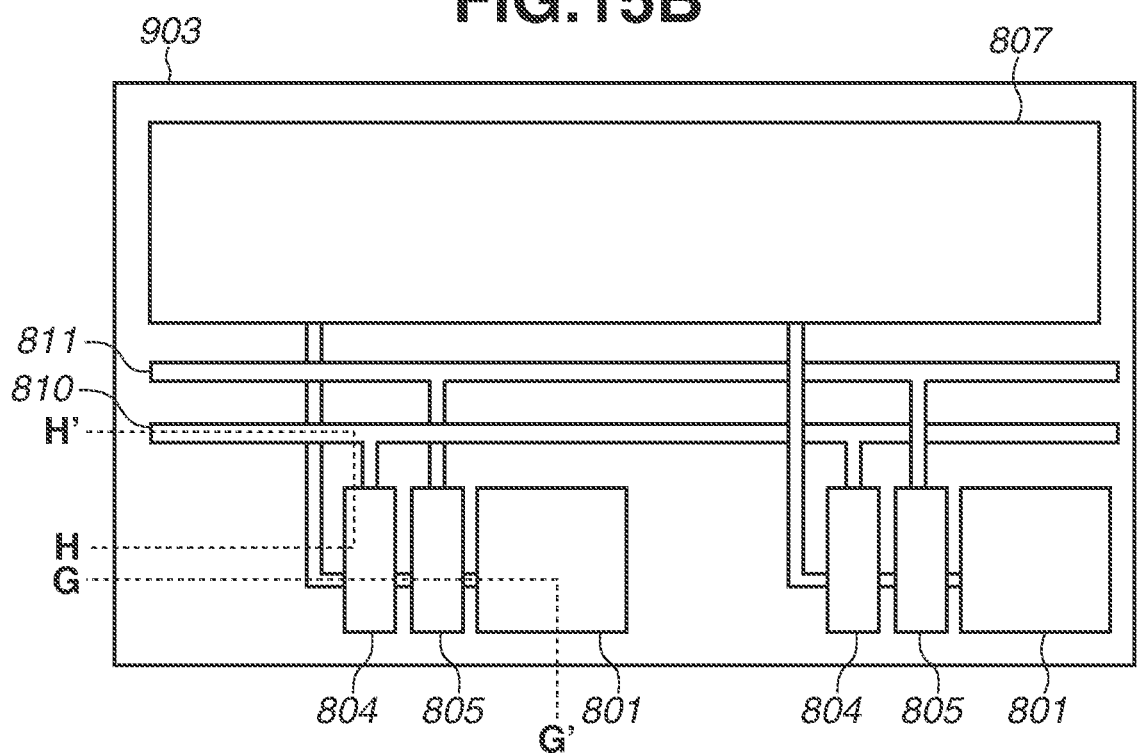

FIGS. 15A and 15B are planar layout diagrams of the electrostatic protection circuits according to the fifth exemplary embodiment of the present disclosure. The same components as those illustrated in FIGS. 1 to 14 are assigned the same reference numerals, and the description thereof will be omitted. In the photoelectric conversion apparatus according to the present exemplary embodiment, two members (chips) respectively illustrated in FIGS. 15A and 15B are bonded together. The pad 800, the diodes 802 and 803, the internal circuit 806, a VDD power supply wiring line 808, and a GND wiring line 809 are formed in a first member 902. The pad 801, the diodes 804 and 805, the internal circuit 807, a VDD power supply wiring line 810, and a GND wiring line 811 are formed in a second member 903.

Figure 16:
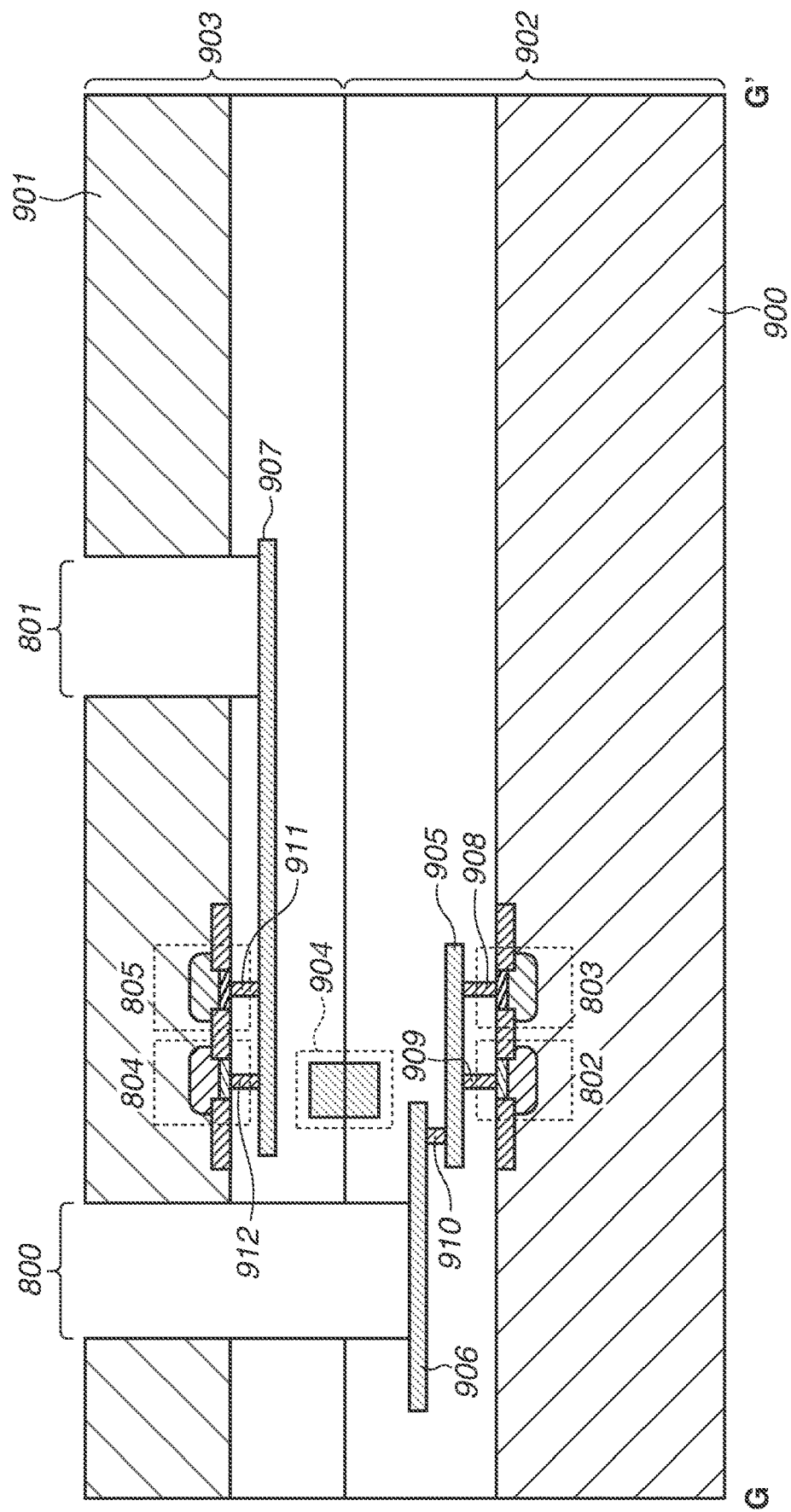
FIG. 16 is a cross-sectional schematic diagram according to the fifth exemplary embodiment.

FIG. 16 is a cross-sectional schematic diagram of the photoelectric conversion apparatus taken along the broken line G-G' in FIGS. 15A and 15B.

In FIG. 16, the same components as those illustrated in FIGS. 1 to 15B are assigned the same reference numerals, and the description thereof will be omitted. In the photoelectric conversion apparatus according to the fifth exemplary embodiment, the first member 902 including a first substrate 900 and the second member 903 including a second substrate 901 are bonded together. The first member 902 and the second member 903 are bonded at a bonding portion 904. The first member 902 includes wiring layers 905 and 906 and contact layers 908 to 910. The second member 903 includes a wiring layer 907 and contact layers 911 and 912. In addition, the diodes 802 and 803 are formed on the first substrate 900 and the diodes 804 and 805 are formed on the second substrate 901. In this example, the structures of the diodes 802 and 803 are similar to those of the diodes 101A and 102A illustrated in FIG. 4. The structures of the diodes 804 and 805 are similar to those of the diodes 101B and 102B illustrated in FIG. 4. In this example, the diode 802 is connected to the pad 800 via the wiring layers 905 and 906 and the contact layers 909 and 910. The diode 803 is connected to the pad 800 via the wiring layers 905 and 906 and the contact layers 908 and 910. In addition, the diode 804 is connected to the pad 801 via the wiring layer 907 and the contact layer 912. The diode 805 is connected to the pad 801 via the wiring layer 907 and the contact layer 911.

Figure 17:
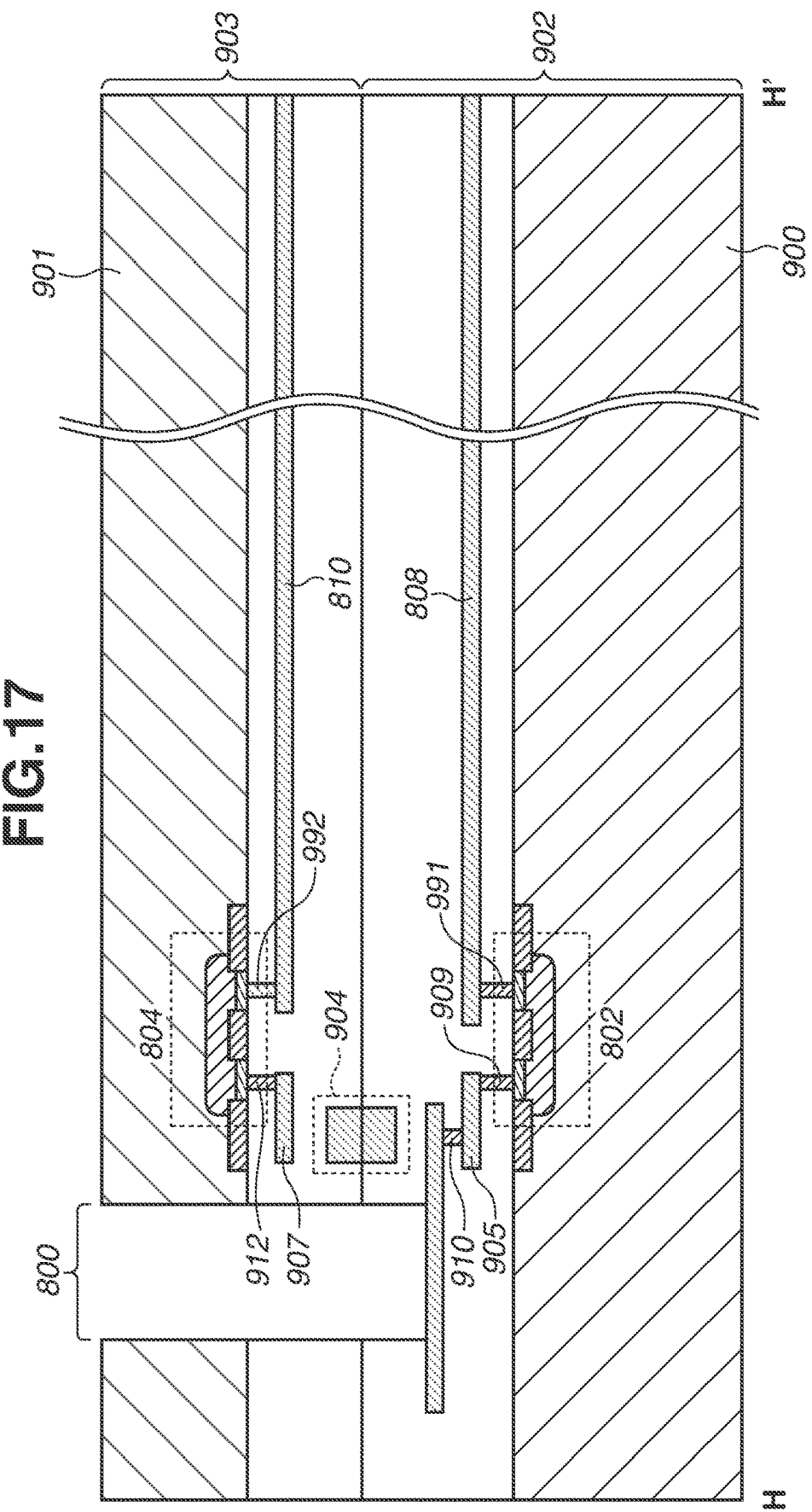
FIG. 17 is a cross-sectional schematic diagram according to the fifth exemplary embodiment.

FIG. 17 is a cross-sectional schematic diagram of the photoelectric conversion apparatus taken along the broken line H-H' in FIGS. 15A and 15B. The same components as those illustrated in FIGS. 1 to 16 are assigned the same reference numerals, and the description thereof will be omitted. The structure of the diode 802 is similar to that of the diode 101A illustrated in FIG. 4, and the diode 802 is connected to the VDD power supply wiring line 808 via a contact layer 991. The structure of the diode 804 is similar to that of the diode 101B illustrated in FIG. 4, and the diode 804 is connected to the VDD power supply wiring line 810 via a contact layer 992.

In the structure according to the present exemplary embodiment, the pad 800 and the diodes 802 and 803, which are formed in the first member 902, are connected to the internal circuit 806 formed in the first member 902. The pad 801 and the diodes 804 and 805, which are formed in the second member 903, are connected to the internal circuit 807 formed in the second member 903. In addition, the diodes 802 and 803 overlap the diodes 804 and 805 in planar view, respectively. With this configuration, also in a case where the first member 902 include the pads 800 and the second member 903 includes the pads 801, it is possible to suppress the increase of the electrostatic protection circuit area in planar view. In addition, because the wiring length between the internal circuit and the pad can be reduced, parasitic resistance between the internal circuit and the pad can be reduced. Accordingly, it is possible to transmit an electric signal input or output via the pad 800 or 801, to the internal circuit at a high speed.

Hereinafter, a structure of a photoelectric conversion apparatus according to a sixth exemplary embodiment of the present disclosure will be described with reference to FIGS. 18 to 20.

Figure 18:
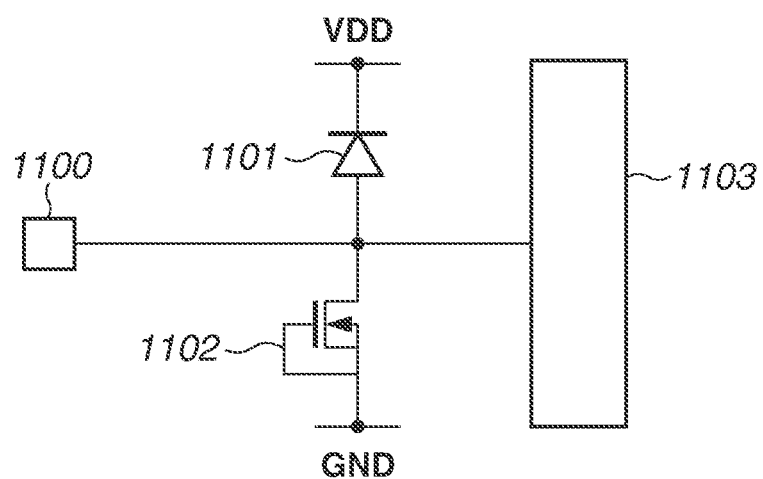
FIG. 18 is an equivalent circuit diagram according to a sixth exemplary embodiment.

FIG. 18 is an equivalent circuit diagram of the photoelectric conversion apparatus according to the sixth exemplary embodiment. The photoelectric conversion apparatus according to the present exemplary embodiment includes a pad 1100, a diode 1101, a N-channel metal oxide semiconductor (NMOS)-type Gate Grounded MOS (GGMOS) 1102, and an internal circuit 1103. A cathode of the diode 1101 is connected to a VDD power supply wiring line, and an anode of the diode 1101 is connected to the pad 1100, a drain of the GGMOS 1102, and the internal circuit 1103. The GGMOS 1102 has the same structure as the structure of a normal MOS transistor except that the GGMOS 1102 connects to a node, to which a GND potential is supplied, while short-circuiting the gate and the source. In addition, the drain of the GGMOS 1102 is connected to the pad 1100, the anode of the diode 1101, and the internal circuit 1103. If a voltage is applied to the drain of the GGMOS 1102, the GGMOS 1102 stays in an operation-suppressed state (where a current flowing between the source and the drain is small enough to be ignored) until the voltage reaches a specific voltage. If the voltage exceeds the specific voltage, a current flows between the source and the drain (which is referred to as a snap-back operation).

In the equivalent circuit illustrated in FIG. 1, if a negative voltage is applied to the pad 100 during a normal operation of the photoelectric conversion apparatus, a current flows to the power supply voltage node GND via the diode 102. This can cause a consumed current increase or an operation failure. In the electrostatic protection circuit according to the present exemplary embodiment, even if a negative voltage is applied to the pad 1100, the GGMOS 1102 stays in the operation-suppressed state, and the influence on the normal operation of the photoelectric conversion apparatus can be minimized. As the diode 1101, a GGMOS may be used in place of a diode. In addition, a circuit element such as a resistive element or a capacitative element may be included in addition to the circuit elements illustrated in FIG. 18.

Figure 19A:
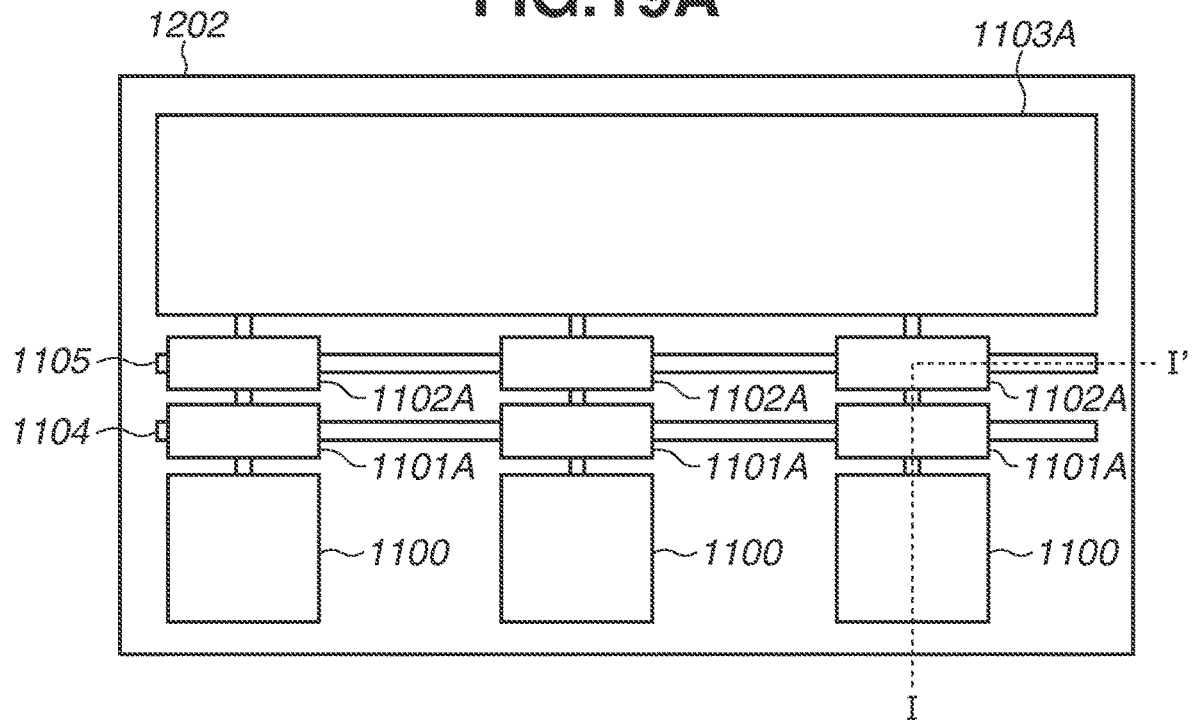
FIGS. 19A and 19B are planar layout diagrams according to the sixth exemplary embodiment.
Figure 19B:
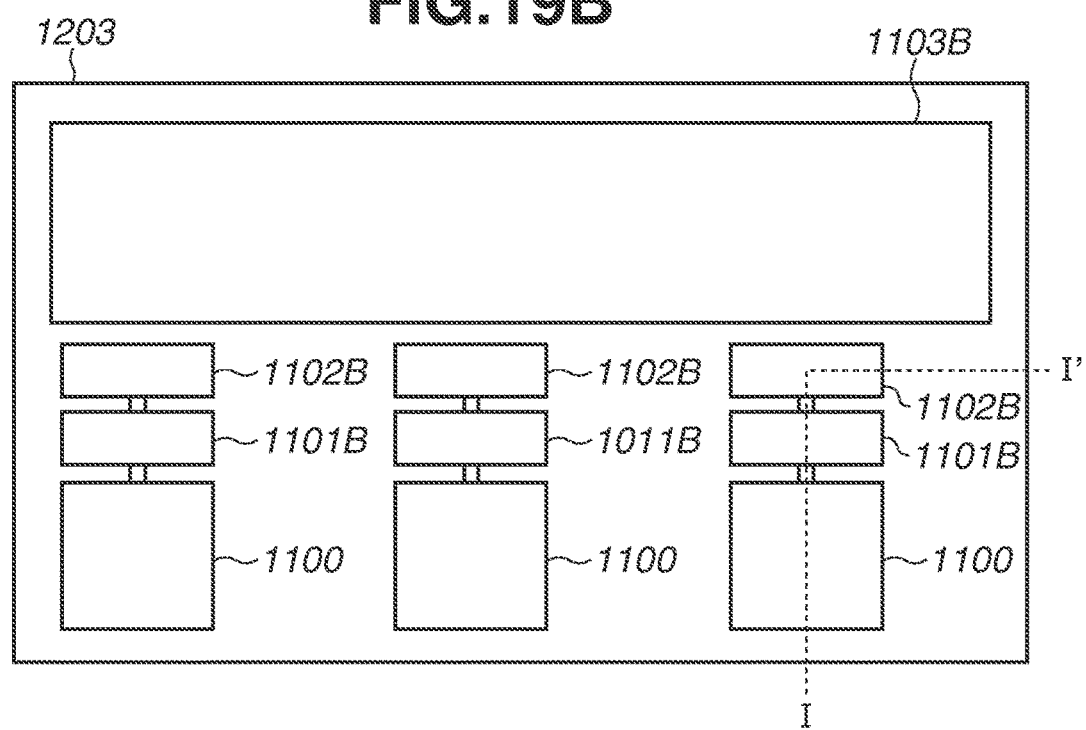

FIGS. 19A and 19B are planar layout diagrams of an electrostatic protection circuit according to the sixth exemplary embodiment. The same components as those illustrated in FIGS. 1 to 18 are assigned the same reference numerals, and the description thereof will be omitted. In this example, diodes 1101A included in a first member 1202 and diodes 1101B included in a second member 1203 each constitute a part of the diode 1101. In addition, GGMOSs 1102A included in the first member 1202 and GGMOSs 1102B included in the second member 1203 each constitute a part of the GGMOS 1102. Furthermore, the photoelectric conversion apparatus according to the present exemplary embodiment includes internal circuits 1103A and 1103B, a VDD power supply wiring line 1104, and a GND wiring line 1105.

The planar layout diagrams illustrated in FIGS. 19A and 19B have a configuration in which the diodes 102A and 102B in the planar layout diagrams illustrated in FIGS. 2A and 2B are replaced with the GGMOSs 1102A and 1102B, respectively. However, the configuration is not limited thereto. A configuration in which the diodes 102A (or 803) and 102B (or 805) illustrated in FIGS. 3A and 3B, FIGS. 10A and 10B, FIGS. 12A and 12B, or FIGS. 15A and 15B are replaced with the GGMOSs 1102A and 1102B, respectively may be employed.

Figure 20:
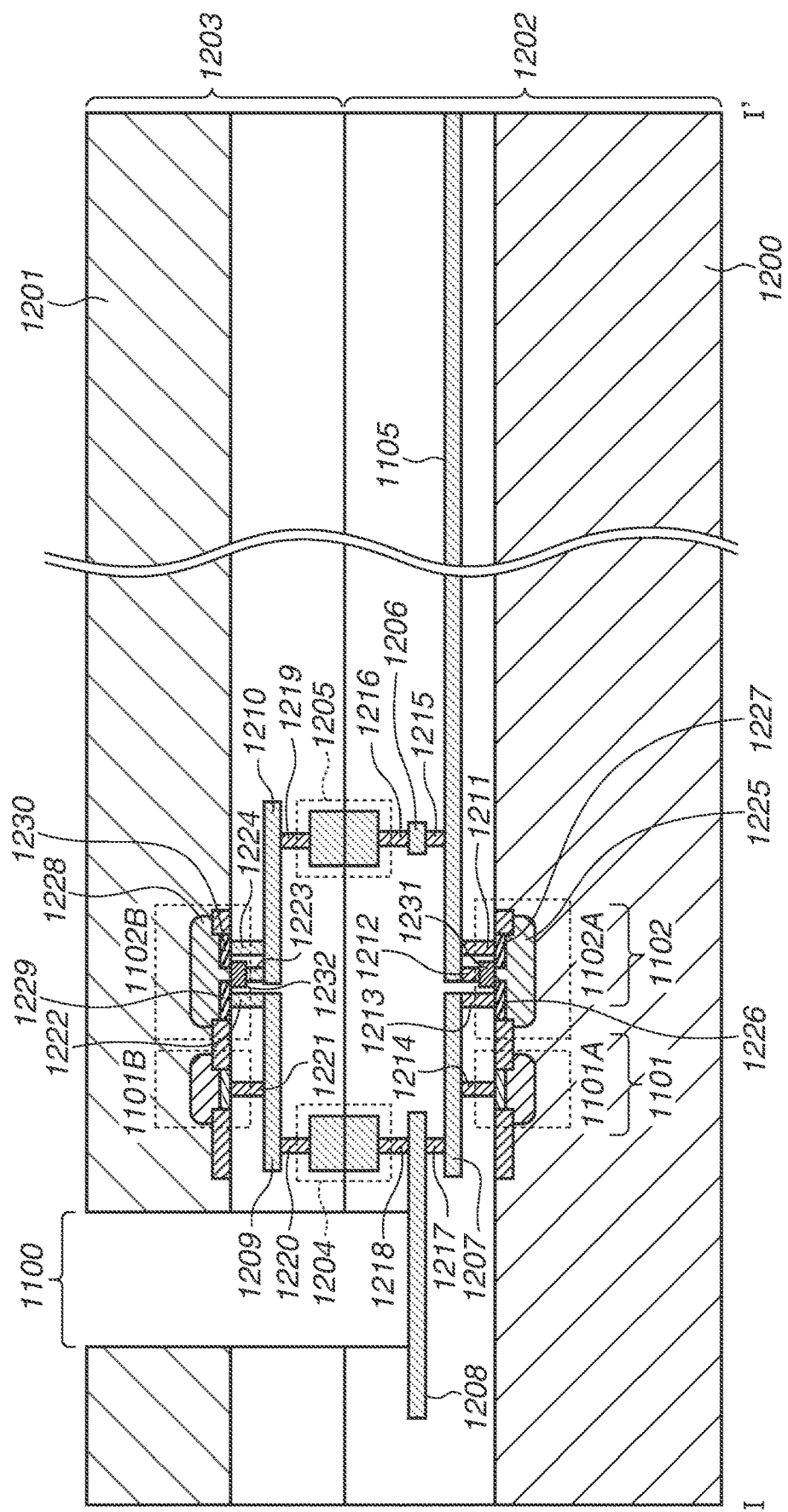
FIG. 20 is a cross-sectional schematic diagram according to the sixth exemplary embodiment.

FIG. 20 is a cross-sectional schematic diagram of the photoelectric conversion apparatus taken along the broken line I-I' in FIGS. 19A and 19B.

In FIG. 20, the same components as those illustrated in FIGS. 1 to 19B are assigned the same reference numerals, and the description thereof will be omitted. In the photoelectric conversion apparatus according to the sixth exemplary embodiment, the first member 1202 including a first substrate 1200 and the second member 1203 including a second substrate 1201 are bonded together. The first member 1202 and the second member 1203 are electrically connected to each other at bonding portions 1204 and 1205. The first member 1202 includes wiring layers 1206 to 1208 and contact layers 1211 to 1218. The second member 1203 includes wiring layers 1209 and 1210 and contact layers 1219 to 1224. The diode 1101A and the GGMOS 1102A are formed on the first substrate 1200, and the diode 1101B and the GGMOS 1102B are formed on the second substrate 1201. In this example, the structures and the connection relationship of the diodes 1101A and 1101B are similar to those of the diodes 101A and 101B illustrated in FIG. 4. The GGMOS 1102A includes a gate electrode 1231, a drain region 1226, and a source region 1227 that are provided on a p-type semiconductor region 1225. The drain region 1226 is connected to the pad 1100 via the wiring layers 1207 and 1208 and the contact layers 1213 and 1217. The gate electrode 1231 and the source region 1227 are connected to the GND wiring line 1105 via the contact layers 1212 and 1211, respectively. The GGMOS 1102B includes a gate electrode 1232, a drain region 1229, and a source region 1230 that are formed on an n-type semiconductor region 1228. The drain region 1229 is connected to the pad 1100 via the wiring layers 1208 and 1209, the bonding portion 1204, and the contact layers 1218, 1220, and 1222. The gate electrode 1232 and the source region 1230 are connected to the GND wiring line 1105 via the wiring layers 1210 and 1206, the bonding portion 1205, and the contact layers 1215, 1216, 1219, 1223, and 1224.

In the present exemplary embodiment, because the electrostatic protection circuit includes a GGMOS, even if a negative voltage is applied to the pad 1100, electrostatic protection can be achieved without an influence on the normal operation. In addition, similarly to the above-described first to fifth exemplary embodiments, an electrostatic protection circuit including a GGMOS can be arranged on each of two laminated substrates. Because an electrostatic protection circuit is provided at a position not overlapping the pad 1100 in planar view, the photoelectric conversion apparatus according to the present exemplary embodiment has an effect that the electrostatic protection circuit is less likely to be affected by the formation of wire bonding on the pad 1100. In addition, similarly to the first exemplary embodiment, the photoelectric conversion apparatus also has an effect of increasing the electrostatic protection circuit area.

Hereinafter, a structure of a photoelectric conversion apparatus according to a seventh exemplary embodiment of the present disclosure will be described with reference to FIGS. 21 to 24.

Figure 21:
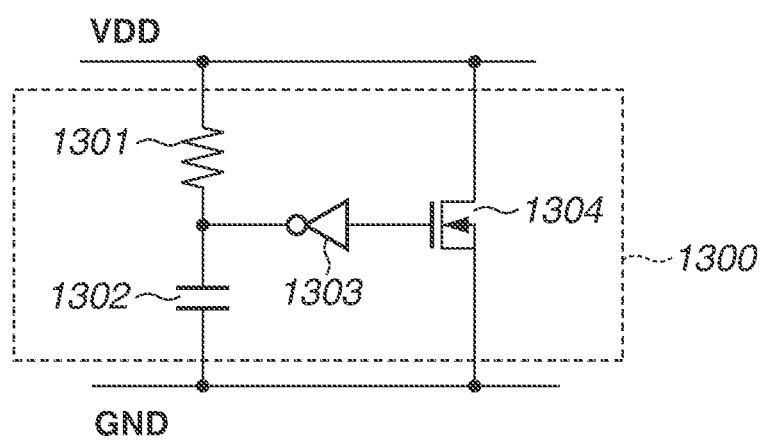
FIG. 21 is an equivalent circuit diagram according to a seventh exemplary embodiment.

FIG. 21 is an equivalent circuit diagram of the photoelectric conversion apparatus according to the seventh exemplary embodiment. The photoelectric conversion apparatus according to the present exemplary embodiment includes a power clamp MOS transistor 1300. The power clamp MOS transistor 1300 is an RC-trigger power clamp MOS transistor. The power clamp MOS transistor 1300 includes a series circuit (hereinafter referred to as an RC series circuit) including a resistive element 1301 and a capacitative element 1302 that are provided between a VDD power supply wiring line and a GND wiring line, and a complementary metal-oxide semiconductor (CMOS) inverter 1303 having an input terminal connected to a connection point of the resistive element 1301 and the capacitative element 1302. In addition, an output terminal of the CMOS inverter 1303 is connected to a gate electrode of a MOS transistor 1304. In the present exemplary embodiment, a 1-stage CMOS inverter is illustrated as the CMOS inverter 1303, but a multi-stage CMOS inverter may be connected. In addition, an N-type MOS transistor is illustrated as the MOS transistor 1304, but a P-type MOS transistor may be employed.

Hereinafter, an operation of the power clamp MOS transistor 1300 will be described. If an excessive positive voltage is applied to the VDD power supply wiring line due to an electrostatic discharge, the potential of the input terminal of the CMOS inverter 1303 becomes lower than the potential of the VDD power supply wiring line within the time constant R×C of the RC series circuit. As a result, the potential of the output terminal of the CMOS inverter 1303 becomes a high level, and the MOS transistor 1304 enters a conductive state (an on state). On the other hand, during the normal operation, the input terminal of the CMOS inverter 1303 becomes a high level and the output terminal becomes a low level. The MOS transistor 1304 thus enters a non-conductive state (an off state). In this manner, the power clamp MOS transistor 1300 is less likely to affect the normal operation. Furthermore, when static electricity is discharged, the MOS transistor 1304 enters the conductive state, and electric charge due to static electricity can be appropriately discharged.

Figure 22A:
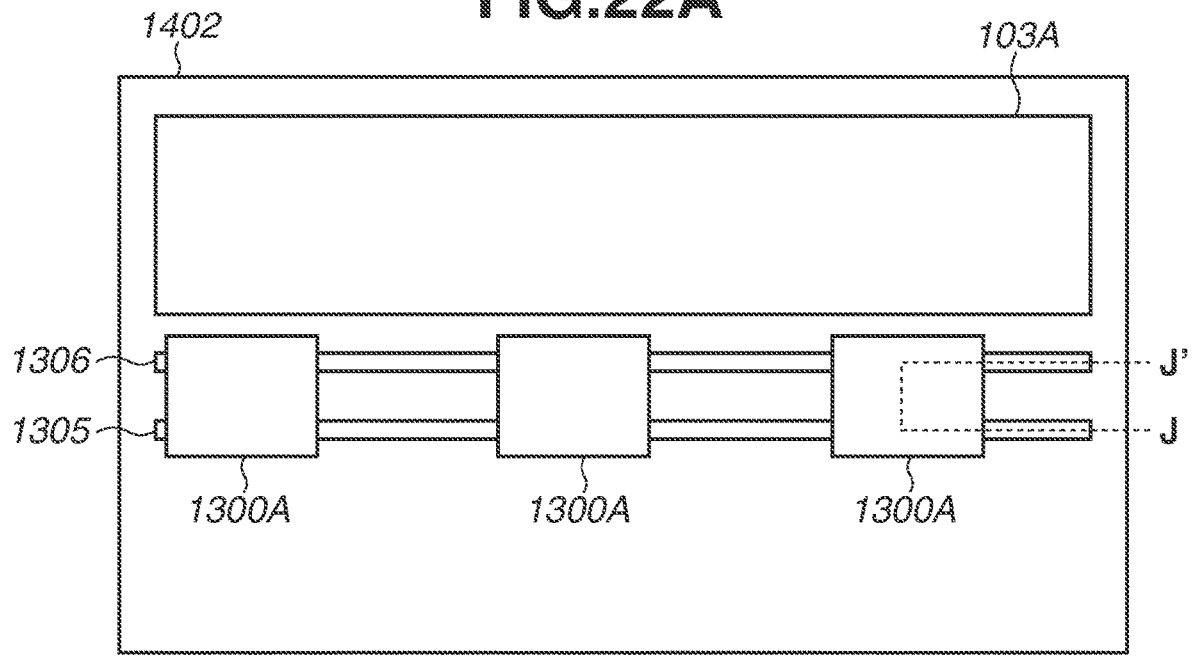
FIGS. 22A and 22B are planar layout diagrams according to the seventh exemplary embodiment.
Figure 22B:
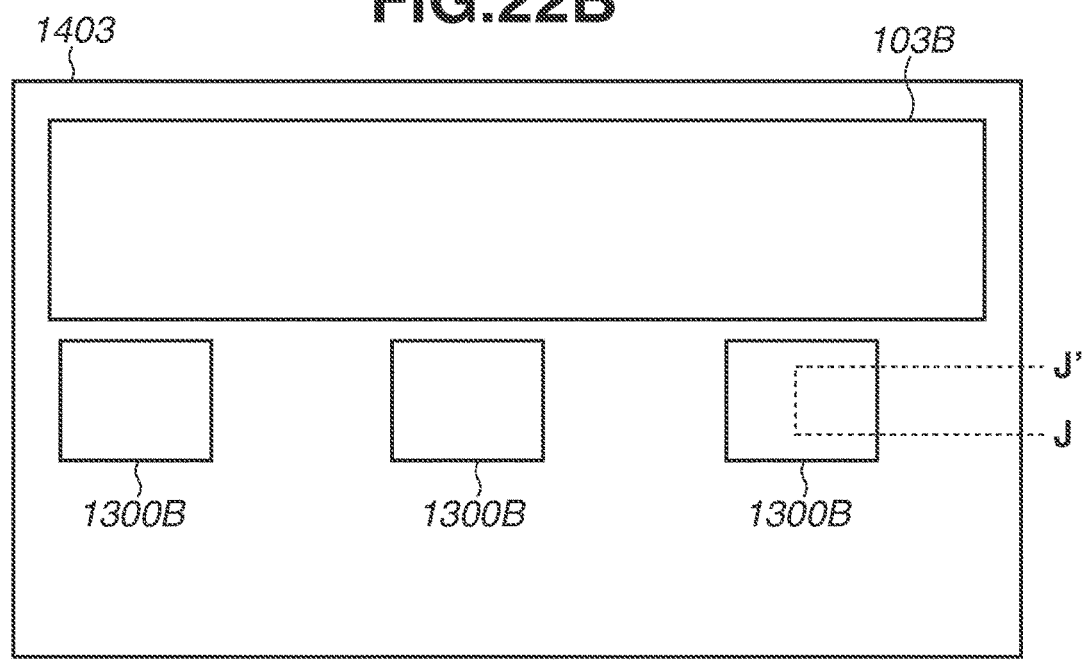

FIGS. 22A and 22B and FIGS. 23A and 23B are planar layout diagrams of an electrostatic protection circuit according to the present exemplary embodiment. The same components as those illustrated in FIGS. 1 to 21 are assigned the same reference numerals, and the description thereof will be omitted. In the photoelectric conversion apparatus according to the present exemplary embodiment, two members (chips) respectively illustrated in FIGS. 22A and 22B are bonded together, and two members (chips) respectively illustrated in FIGS. 23A and 23B are bonded together. The electrostatic protection circuit includes power clamp MOS transistors 1300A and 1300B, a VDD power supply wiring line 1305, and a GND wiring line 1306. In this example, the power clamp MOS transistor 1300A, the VDD power supply wiring line 1305, and the GND wiring line 1306 are formed in a first member 1402. The power clamp MOS transistor 1300B is formed in a second member 1403.

In the planar layout diagrams illustrated in FIGS. 22A and 22B, the power clamp MOS transistors 1300A and 1300B are arranged in a region overlapping at least one of the VDD power supply wiring line 1305 and the GND wiring line 1306 in planar view. In the planar layout diagrams illustrated in FIGS. 23A and 23B, the power clamp MOS transistors 1300A and 1300B are arranged so as not to overlap the VDD power supply wiring line 1305 or the GND wiring line 1306 in planar view.

Figure 24:
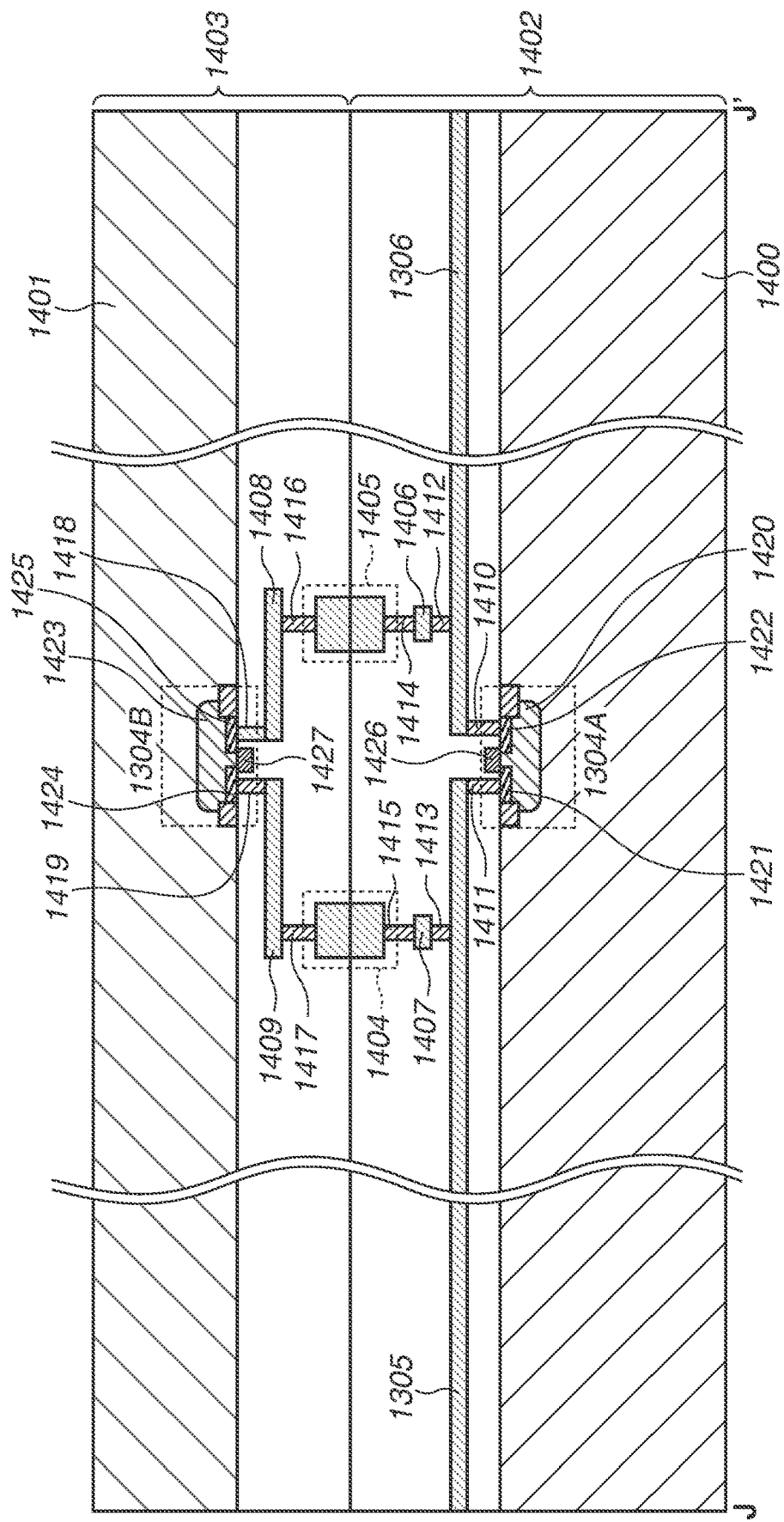
FIG. 24 is a cross-sectional schematic diagram according to the seventh exemplary embodiment.

FIG. 24 is a cross-sectional schematic diagram of the photoelectric conversion apparatus taken along the broken line J-J' in FIGS. 22A, 22B, 23A, and 23B.

In FIG. 24, the same components as those illustrated in FIGS. 1 to 23B are assigned the same reference numerals, and the description thereof will be omitted. In the photoelectric conversion apparatus according to the sixth exemplary embodiment, the first member 1402 including a first substrate 1400 and the second member 1403 including a second substrate 1401 are bonded together. The first member 1402 and the second member 1403 are electrically connected to each other at bonding portions 1404 and 1405. The first member 1402 includes wiring layers 1406 and 1407 and contact layers 1410 to 1415. The second member 1403 includes wiring layers 1408 and 1409 and contact layers 1416 to 1419. In addition, the power clamp MOS transistor 1300A is formed on the first substrate 1400 and the power clamp MOS transistor 1300B is formed on the second substrate 1401. For the sake of simplification, FIG. 24 mainly illustrates MOS transistors 1304A and 1304B. The MOS transistor 1304A includes a gate electrode 1426, a drain region 1421, and a source region 1422 that are provided on a p-type semiconductor region 1420. In this example, the drain region 1421 is connected to the VDD power supply wiring line 1305 via the contact layer 1411. The source region 1422 is connected to the GND wiring line 1306 via the contact layer 1410.

The MOS transistor 1304B includes a gate electrode 1427, a drain region 1424, and a source region 1425 that are provided on a p-type semiconductor region 1423. The drain region 1424 is connected to the VDD power supply wiring line 1305 via the wiring layers 1409 and 1407, the bonding portion 1404, and the contact layers 1413, 1415, 1417, and 1419. The source region 1425 is connected to the GND wiring line 1306 via the wiring layers 1406 and 1408, the bonding portion 1405, and the contact layers 1412, 1414, 1416, and 1418.

In the present exemplary embodiment, by arranging a power clamp MOS transistor on each of two laminated members, the circuit area of a power clamp element can be increased. With this configuration, the protection capability of the electrostatic protection circuit can be enhanced.

Hereinafter, an electrostatic protection circuit included in a solid-state imaging apparatus having a laminated structure will be described as an electrostatic protection circuit according to an eighth exemplary embodiment of the present disclosure. An image sensor (CMOS image sensor) will be described as the solid-state imaging apparatus according to the present exemplary embodiment. The configuration of the image sensor to be described in the present exemplary embodiment is a mere example, and the configuration is not limited thereto. For example, the electrostatic protection circuit can also be applied to a distance measuring apparatus that measures the distance to a target object, a photometric apparatus that measures the intensity of light from a subject, or a line sensor used in a document reading unit of a copier.

In addition, the laminated structure according to the present exemplary embodiment is not limited to the laminated structure with two members (chips). As another variation, a laminated structure with three or more members (chips) may be employed. In the present exemplary embodiment, one or more electrostatic protection circuits are arranged in two or more laminated members (chips). The number of members (chips) for forming a laminated structure, and the number of semiconductor substrates on which electrostatic protection circuits are formed need not be always the same.

Figure 25:
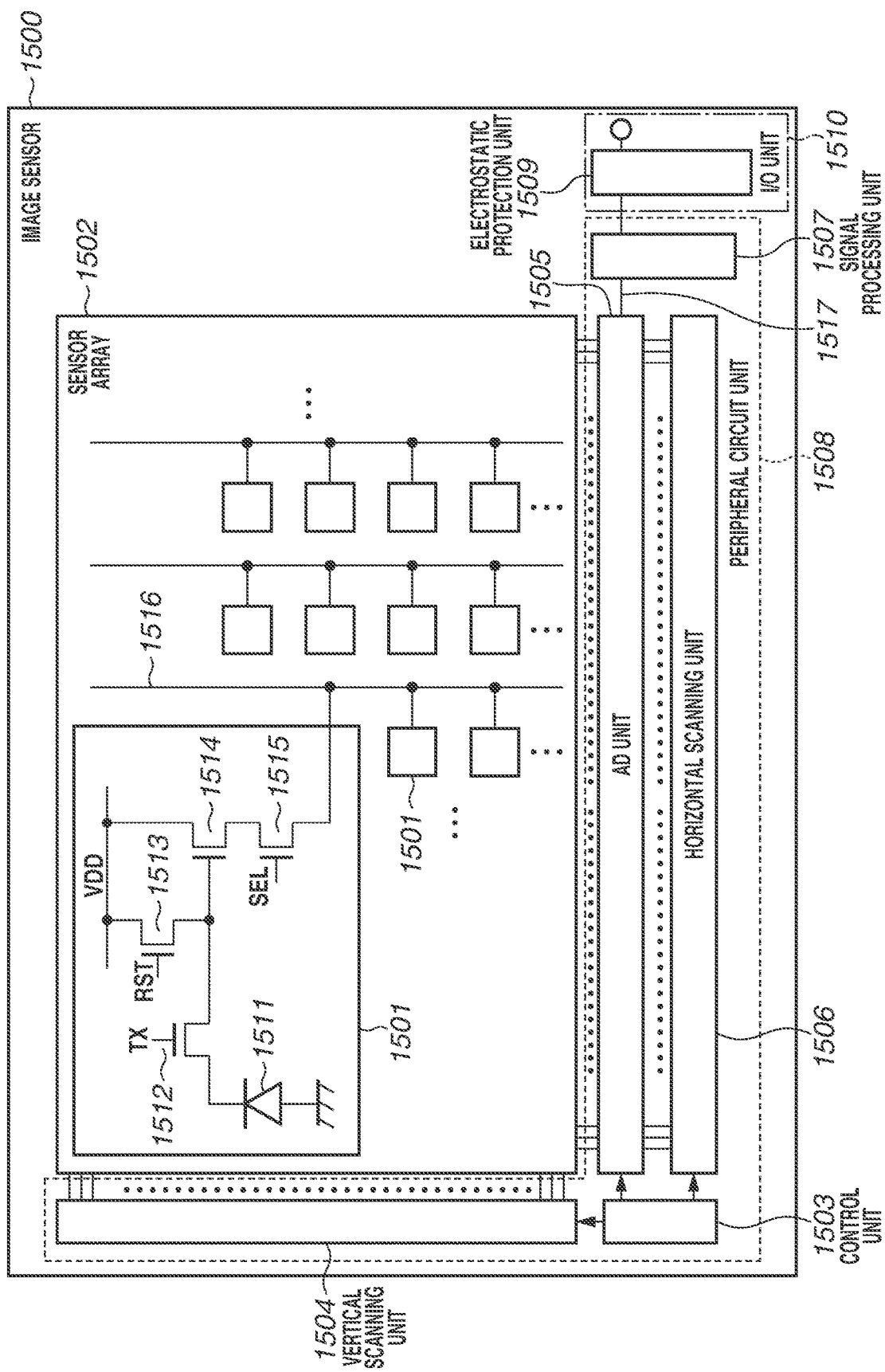
FIG. 25 is an overview diagram according to an eighth exemplary embodiment.

First of all, a configuration of the image sensor according to the present exemplary embodiment will be described with reference to FIG. 25. FIG. 25 is a block diagram illustrating the concept of the image sensor according to the present exemplary embodiment, and the arrangement layout of components is different from the actual arrangement layout. The image sensor according to the present exemplary embodiment has a laminated structure as described below, and the arrangement of circuits will be described below with reference to FIG. 26. First of all, the functions of the circuits included in the image sensor will be described with reference to FIG. 25.

An image sensor 1500 includes a sensor array 1502 including sensors 1501 arranged in a plurality of rows and a plurality of columns. Each of the sensors 1501 includes a photoelectric conversion element (photoelectric conversion unit) for converting incident light into signal charge, and outputs the signal charge as an analog electric signal. The image sensor 1500 also includes a control unit 1503 that controls the entire image sensor 1500, a vertical scanning unit 1504 that selects a sensor row in which analog electric signals are to be output, from among the sensor array 1502, and an analog-to-digital (AD) unit 1505 that converts an analog electric signal into a digital signal. The image sensor 1500 further includes a horizontal scanning unit 1506 that selects a digital signal held in a column memory of the AD unit 1505 and outputs the digital signal, and at least one signal processing unit, here a signal processing unit 1507, that processes the output digital signal. A peripheral circuit unit 1508 includes the control unit 1503, the vertical scanning unit 1504, the AD unit 1505, the horizontal scanning unit 1506, and the signal processing unit 1507. The image sensor 1500 further includes an electrostatic protection unit 1509 having a function of dissipating an electrostatic discharge entering from an input-output terminal, to a VDD power supply wiring line or a GND wiring line. The image sensor 1500 further includes an input-output (I/O) unit 1510 including an input-output terminal portion having a pad. The pad serves as an electrical connection portion where metal wiring is partially opened to enable connection to the outside.

Each of the sensors 1501 included in the sensor array 1502 includes a photodiode (PD) 1511, a transfer transistor (TX Tr) 1512, a reset transistor (RST Tr) 1513, and an amplification transistor 1514. Each of the sensors 1501 also includes a row selection transistor (SEL Tr) 1515. Pixel signals acquired by the sensors 1501 in the sensor row selected by the vertical scanning unit 1504 are transmitted to the AD unit 1505, which is a part of the peripheral circuit unit 1508, via a vertical output line 1516. The configuration is not limited to a configuration in which the vertical output line 1516 and the AD unit 1505 are arranged to correspond to each column of the sensor array 1502. For example, a memory included in the AD unit 1505, which is comprised by a circuit such as a flip-flop circuit, may be provided for each column of the sensor array 1502, each block of the sensor array 1502, or one sensor array 1502.

Analog electric signals output from the sensor array 1502 are converted by the AD unit 1505 into digital signals, and are temporarily stored into a column memory. The column memory is included in a part of the AD unit 1505 and the illustration thereof is omitted in FIG. 25. The digital signals obtained by AD conversion are subjected to parallel-serial conversion in conjunction with the driving of the horizontal scanning unit 1506, and then sequentially subjected to signal processing by the signal processing unit 1507 via a horizontal output line 1517. More specifically, the signal processing performed by the signal processing unit 1507 includes noise removal processing that uses correlated double sampling (CDS), and signal correction processing. The processed signals are output to the outside of the image sensor 1500 via the I/O unit 1510.

Figure 26:
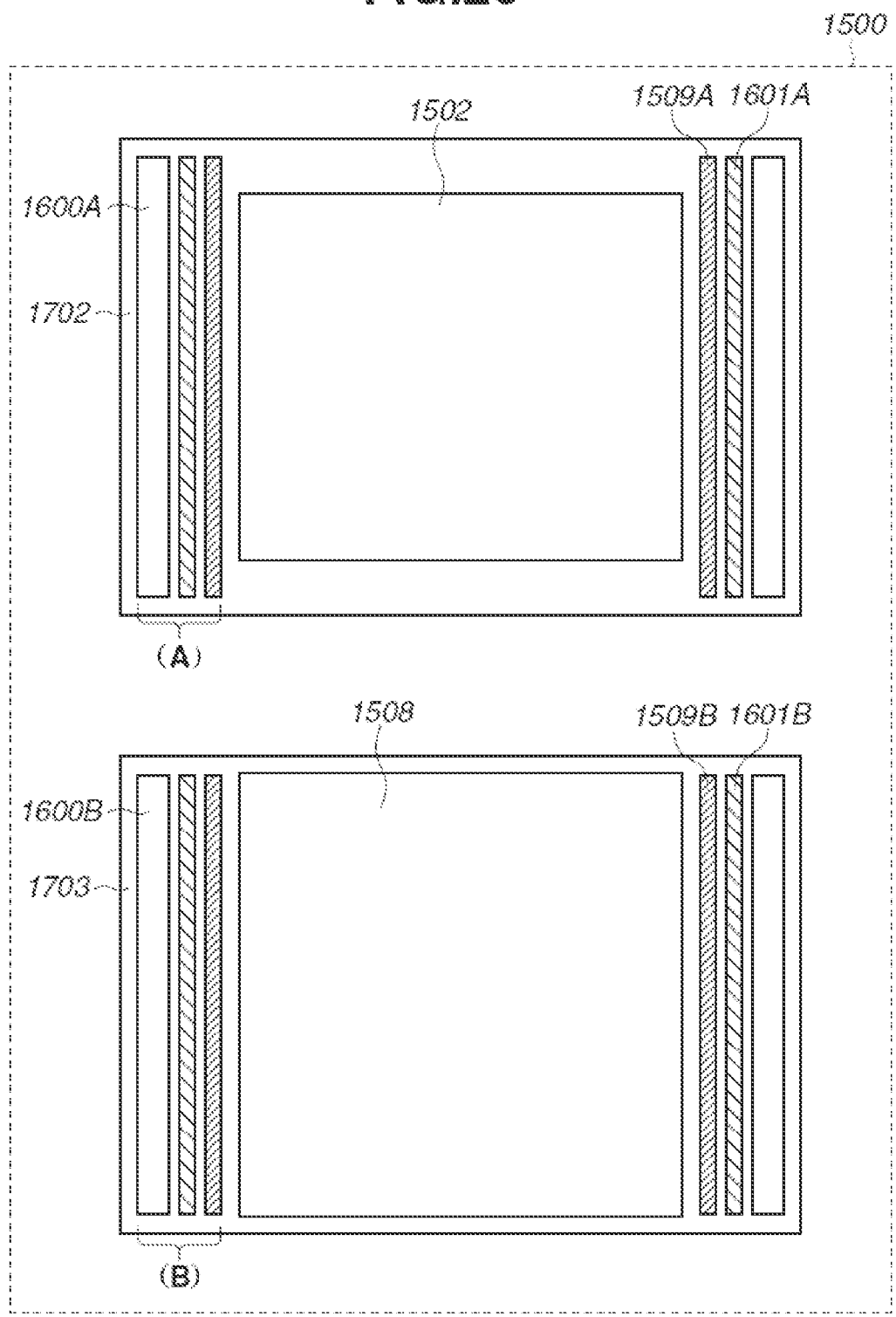
FIG. 26 includes planar layout diagrams according to the eighth exemplary embodiment.

FIG. 26 includes diagrams illustrating an example of a configuration of each semiconductor substrate in the image sensor 1500 according to the present exemplary embodiment that has a laminated structure. The image sensor 1500 has a laminated structure with a first member 1702 and a second member 1703. In the laminated structure, the first member 1702 includes the sensor array 1502 in which the sensors 1501 illustrated in FIG. 25 are arranged, and a PAD unit 1600A. The first member 1702 further includes a substrate connection portion 1601A that electrically connects a semiconductor substrate (A) and a semiconductor substrate (B), and the I/O unit 1510 including an electrostatic protection unit 1509A. The semiconductor substrate (A) and the semiconductor substrate (B) can be bonded by a known method discussed in Japanese Patent Application Laid-Open No. 2012-033878, for example. In addition, the substrate connection portion 1601A serving as a connection portion in the laminated structure may have a Through Silicon Via (TSV) structure, for example. Alternatively, the substrate connection portion 1601A may have a Cu—Cu-Bonding (CCB) structure in which copper electrodes having exposed surfaces are prepared in the respective insulation layers of a plurality of chips and the plurality of chips is bonded in such a manner that the copper electrodes are bonded to each other. The CCB is sometimes referred to as hybrid bonding. Alternatively, the substrate connection portion 1601A may have a microbump structure.

In the present exemplary embodiment, principal surfaces of the semiconductor substrate (A) and the semiconductor substrate (B) are regarded as the front surfaces of the substrates. In each of the substrates, the surface opposite to the principal surface is regarded as the back surface. The image sensor 1500 has a configuration in which the principal surface of the semiconductor substrate (A) and the principal surface of the semiconductor substrate (B) are bonded together. As another example, the image sensor 1500 may have a configuration in which the principal surface and the back surface of the substrates are bonded, or a configuration in which the back surfaces of the substrates are bonded. Regarding the connection of the laminated structure described above, the substrate connection portion 1601A may be arranged so as to be suitable for each purpose such as for control signals, power supply, or sensor signals. The substrate connection portion 1601A need not be always arranged on each of the left and right sides of the substrate. A dummy substrate connection portion, which is not illustrated in FIG. 26, may be arranged to enhance the reliability of bonding between the substrates, in addition to the electrical connection portion. The semiconductor substrate (B) includes the peripheral circuit unit 1508 including the control unit 1503, the AD unit 1505, the signal processing unit 1507, the vertical scanning unit 1504, and the horizontal scanning unit 1506. The semiconductor substrate (B) further includes a PAD unit 1600B, a substrate connection portion 1601B electrically connecting the semiconductor substrate (A) and the semiconductor substrate (B), and the I/O unit 1510 including an electrostatic protection unit 1509B.

A plurality of the I/O units 1510 is arranged in the image sensor 1500, and includes a pad for outputting a pixel signal that is based on a signal photoelectrically-converted by the image sensor 1500, and a pad to which a voltage for driving the peripheral circuit unit 1508 is input from the outside. After the semiconductor substrate (A) and the semiconductor substrate (B) are laminated, an external terminal is connected to the PAD unit 1600B via the PAD unit 1600A (opening). Examples of the external terminal include a bonding wire connected to the PAD unit 1600B by a wire bonding method. The PAD unit 1600A being an opening and the PAD unit 1600B need not be always arranged on the semiconductor substrate (A) and the semiconductor substrate (B), respectively. For example, the PAD unit 1600B being an opening and the PAD unit 1600A may be arranged on the semiconductor substrate (A) and the semiconductor substrate (B), respectively. In addition, in FIG. 26, the peripheral circuit unit 1508 is arranged on the semiconductor substrate (B). The circuit of each of the control unit 1503, the AD unit 1505, the signal processing unit 1507, the vertical scanning unit 1504, and the horizontal scanning unit 1506 that are included in the peripheral circuit unit 1508 may be entirely or partially arranged on the semiconductor substrate (A).

Figure 27A:
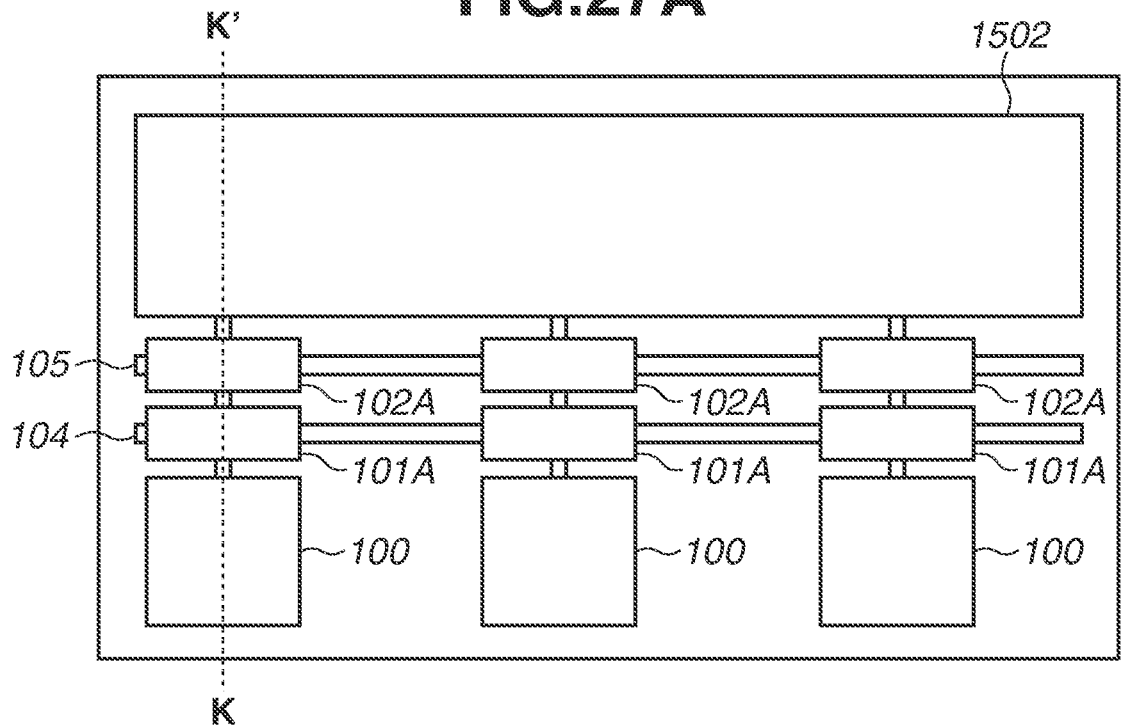
FIGS. 27A and 27B are planar layout diagrams according to the eighth exemplary embodiment.
Figure 27B:
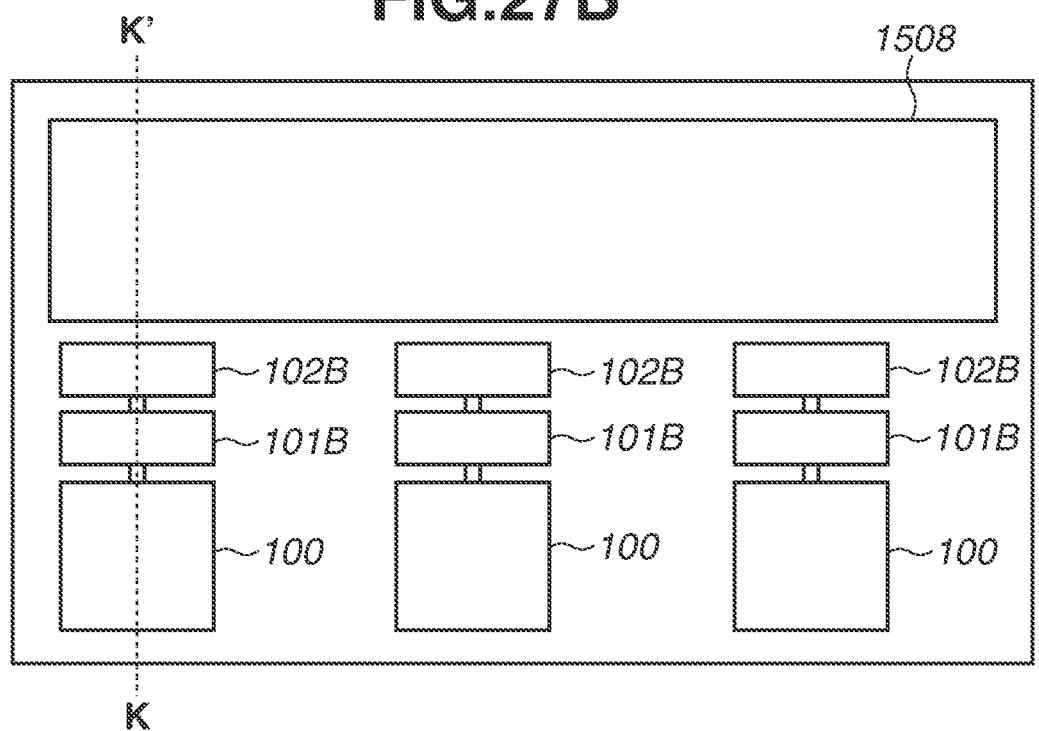

FIGS. 27A and 27B are planar layout diagrams illustrating the periphery of the I/O unit 1510 according to the eighth exemplary embodiment. In FIGS. 27A and 27B, the same components as those illustrated in FIGS. 1 to 26 are assigned the same reference numerals, and the description thereof will be omitted. In this example, the configuration of the electrostatic protection circuit is similar to the configuration illustrated in FIG. 2, but a configuration similar to any of the configurations illustrated in FIGS. 3A and 3B, FIGS. 6A and 6B, FIGS. 7A and 7B, FIGS. 10A and 10B, FIGS. 12A and 12B, FIGS. 15A and 15B, and FIGS. 19A and 19B may be used, or a combination thereof may be used.

Figure 28:
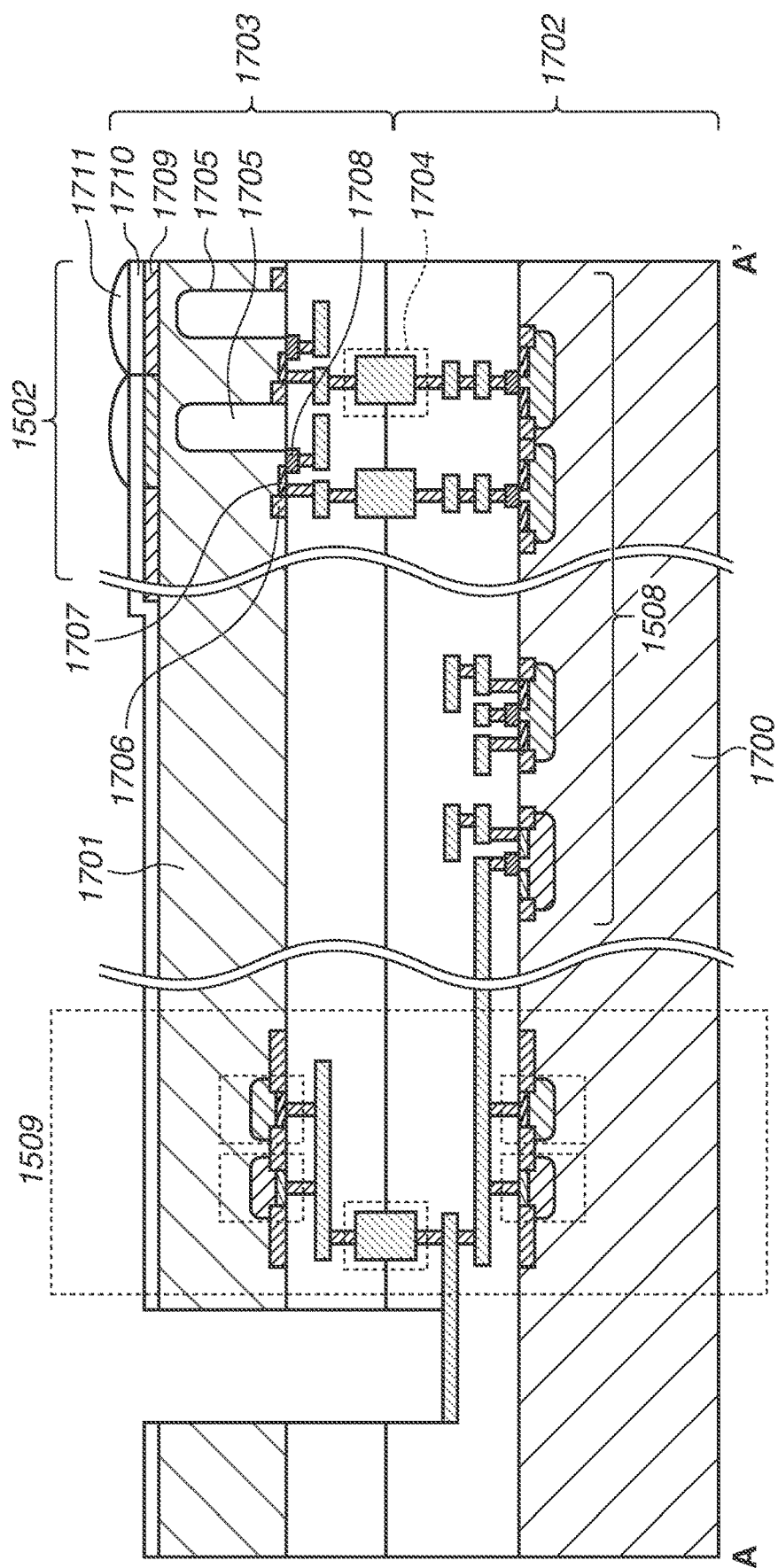
FIG. 28 is a cross-sectional schematic diagram according to the eighth exemplary embodiment.

FIG. 28 is a cross-sectional schematic diagram of the photoelectric conversion apparatus taken along the broken line K-K' in FIGS. 27A and 27B. In FIG. 28, the same components as those illustrated in FIGS. 1 to 27B are assigned the same reference numerals, and the description thereof will be omitted. In the photoelectric conversion apparatus according to the eighth exemplary embodiment, the first member 1702 including a first substrate 1700 and the second member 1703 including a second substrate 1701 are bonded together by a bonding portion 1704 (FIG. 28). In the image sensor 1500 illustrated in FIG. 28, the electrostatic protection unit 1509 is similar in configuration and connection relationship to the electrostatic protection circuit illustrated in FIG. 4. In the present exemplary embodiment, the peripheral circuit unit 1508 is formed in place of the internal circuit 103A illustrated in FIG. 4, and the sensor array 1502 is formed in place of the internal circuit 103B illustrated in FIG. 4.

An n-type semiconductor region 1707, an n-type semiconductor region 1705 serving as the drain of a transfer transistor 1512, and an element isolation structure 1706, which constitute the photoelectric conversion element, are arranged in the sensor array 1502. The transfer transistor 1512 includes the n-type semiconductor region 1705, the n-type semiconductor region 1707, and a gate electrode 1708. In this example, signal charge accumulated in the n-type semiconductor region 1705 is transferred to the n-type semiconductor region 1707 by the gate electrode 1708. On the back surface side of the sensor array 1502, a color filter layer 1709 including a plurality of color filters, a planarizing layer 1710, and a microlens layer 1711 including a plurality of microlenses are arranged. In FIG. 28, each of the plurality of color filters and each of the plurality of microlenses are arranged for a corresponding one of the photoelectric conversion elements. In other words, each of the plurality of color filters and each of the plurality of microlenses are arranged for a corresponding one of the pixels. Alternatively, one color filter and one microlens may be arranged for a plurality of the pixels. Referring to FIG. 28, the description has been given of a back-illuminated image sensor in which light enters from the microlens layer 1711 side and is received by the n-type semiconductor region 1705 of the photoelectric conversion element. However, the configuration of the image sensor 1500 that has been described in the present exemplary embodiment is a mere example, and the configuration is not limited thereto. At least part of the peripheral circuits such as the control unit 1503, the AD unit 1505, the vertical scanning unit 1504, and the horizontal scanning unit 1506 is arranged in the peripheral circuit unit 1508. FIG. 28 illustrates an n-type transistor and a p-type transistor in any circuit included in the peripheral circuit unit 1508.

In the present exemplary embodiment, in the image sensor 1500 in which two semiconductor substrates are laminated, an electrostatic protection circuit is arranged on each of the laminated semiconductor substrates. With this configuration, it is possible to increase the occupied area of the electrostatic protection circuit without receiving a pressure caused by wire bonding formation. This can enhance the characteristics of the electrostatic protection circuit while reducing the influence of wire bonding and ensuring operation stability. Alternatively, by increasing the occupied area of the image sensor instead of increasing the occupied area of the electrostatic protection circuit, a higher pixel count and higher sensitivity can be achieved. Alternatively, by increasing the occupied area of the peripheral circuits in the image sensor, such as a circuit for reading out pixel signals and a circuit for processing the read-out pixel signals, instead of increasing the occupied area of the electrostatic protection circuit, higher speed and higher functionality can be achieved.

Figure 29:
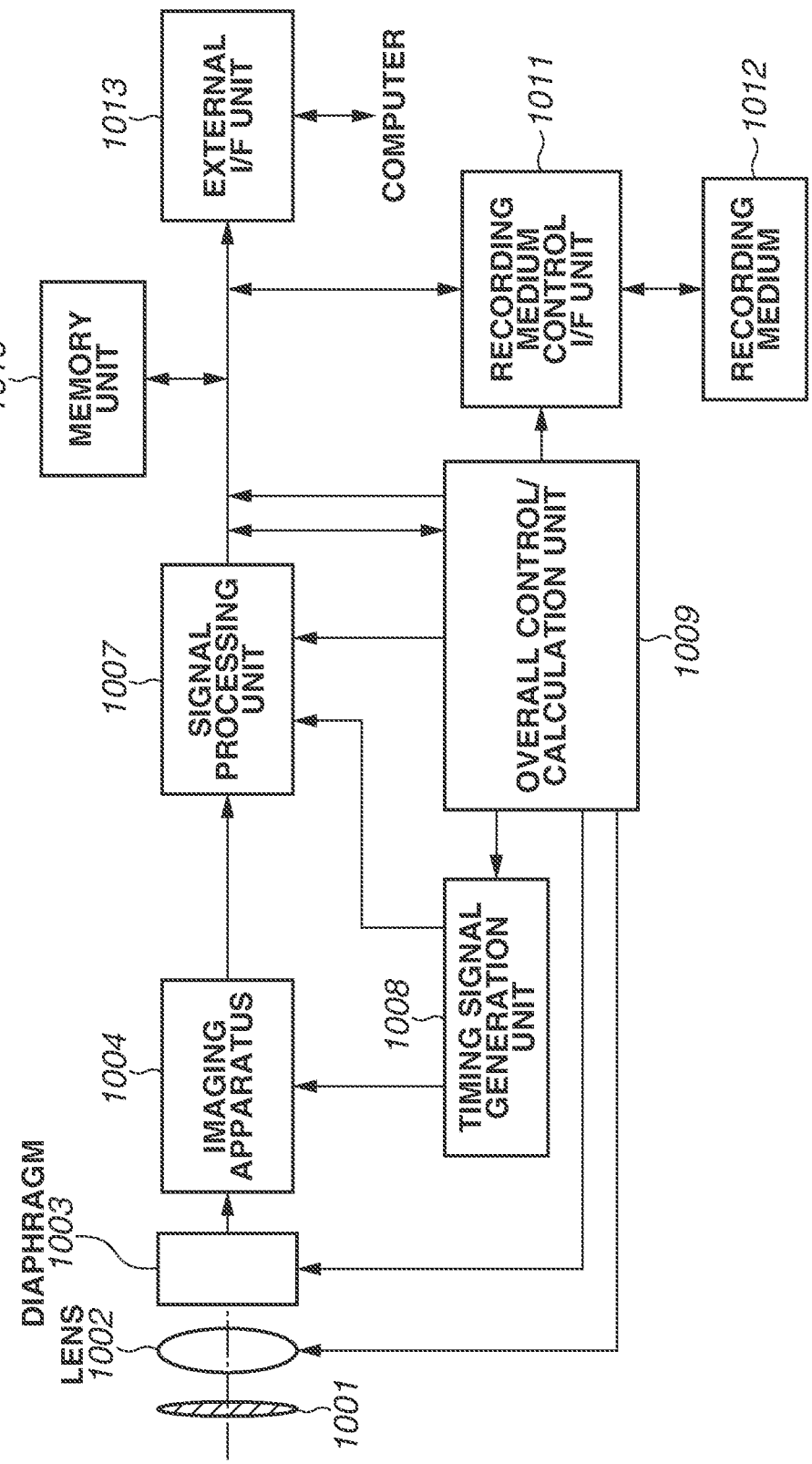
FIG. 29 is a diagram illustrating a configuration of a photoelectric conversion system according to a ninth exemplary embodiment.

A photoelectric conversion system according to a ninth exemplary embodiment of the present disclosure will be described with reference to FIG. 29. FIG. 29 is a block diagram illustrating a schematic configuration of the photoelectric conversion system according to the present exemplary embodiment.

The imaging apparatus described in the above-described first to eight exemplary embodiments can be applied to various photoelectric conversion systems. Examples of the photoelectric conversion systems include a digital still camera, a digital camcorder, a monitoring camera, a copier, a facsimile, a mobile phone, an in-vehicle camera, and an observation satellite. In addition, a camera module including an optical system such as a lens, and an imaging apparatus is also included in the photoelectric conversion systems. As an example of the photoelectric conversion systems, FIG. 29 illustrates a block diagram of a digital still camera.

The photoelectric conversion system illustrated in FIG. 29 includes an imaging apparatus 1004, a lens 1002 that forms an optical image of a subject on the imaging apparatus 1004, a diaphragm 1003 for varying the amount of light passing through the lens 1002, and a barrier 1001 for protecting the lens 1002. The lens 1002 and the diaphragm 1003 serve as an optical system that condenses light onto the imaging apparatus 1004. The imaging apparatus 1004 is the photoelectric conversion apparatus (imaging apparatus) according to any of the above-described exemplary embodiments, and converts an optical image formed by the lens 1002, into an electric signal.

The photoelectric conversion system further includes a signal processing unit 1007 serving as an image generation unit that generates an image by processing an signal output by the imaging apparatus 1004. The signal processing unit 1007 performs an operation of outputting image data after performing various types of correction and compression as necessary. The signal processing unit 1007 may be formed on a semiconductor substrate on which the imaging apparatus 1004 is provided, or may be formed on another semiconductor substrate.

The photoelectric conversion system further includes a memory unit 1010 for temporarily storing image data, and an external interface unit (external I/F unit) 1013 for communicating with an external computer. The photoelectric conversion system further includes a recording medium 1012 such as a semiconductor memory for recording or reading out captured image data, and a recording medium control interface unit (recording medium control I/F unit) 1011 for recording or reading the image data to or from the recording medium 1012. The recording medium 1012 may be built into the photoelectric conversion system, or may be detachably attached to the photoelectric conversion system.

The photoelectric conversion system further includes an overall control/calculation unit 1009 that controls various types of calculation and the entire digital still camera, and a timing signal generation unit 1008 that outputs various timing signals to the imaging apparatus 1004 and the signal processing unit 1007. The timing signals may be input from the outside. The photoelectric conversion system includes at least the imaging apparatus 1004 and the signal processing unit 1007 that processes a signal output from the imaging apparatus 1004.

The imaging apparatus 1004 outputs an imaging signal to the signal processing unit 1007. The signal processing unit 1007 performs predetermined signal processing on the imaging signal output from the imaging apparatus 1004, and outputs image data. The signal processing unit 1007 generates an image using the imaging signal.

In this manner, according to the present exemplary embodiment, a photoelectric conversion system to which the photoelectric conversion apparatus (imaging apparatus) according to any of the above-described exemplary embodiments is applied can be implemented.

Figure 30A:
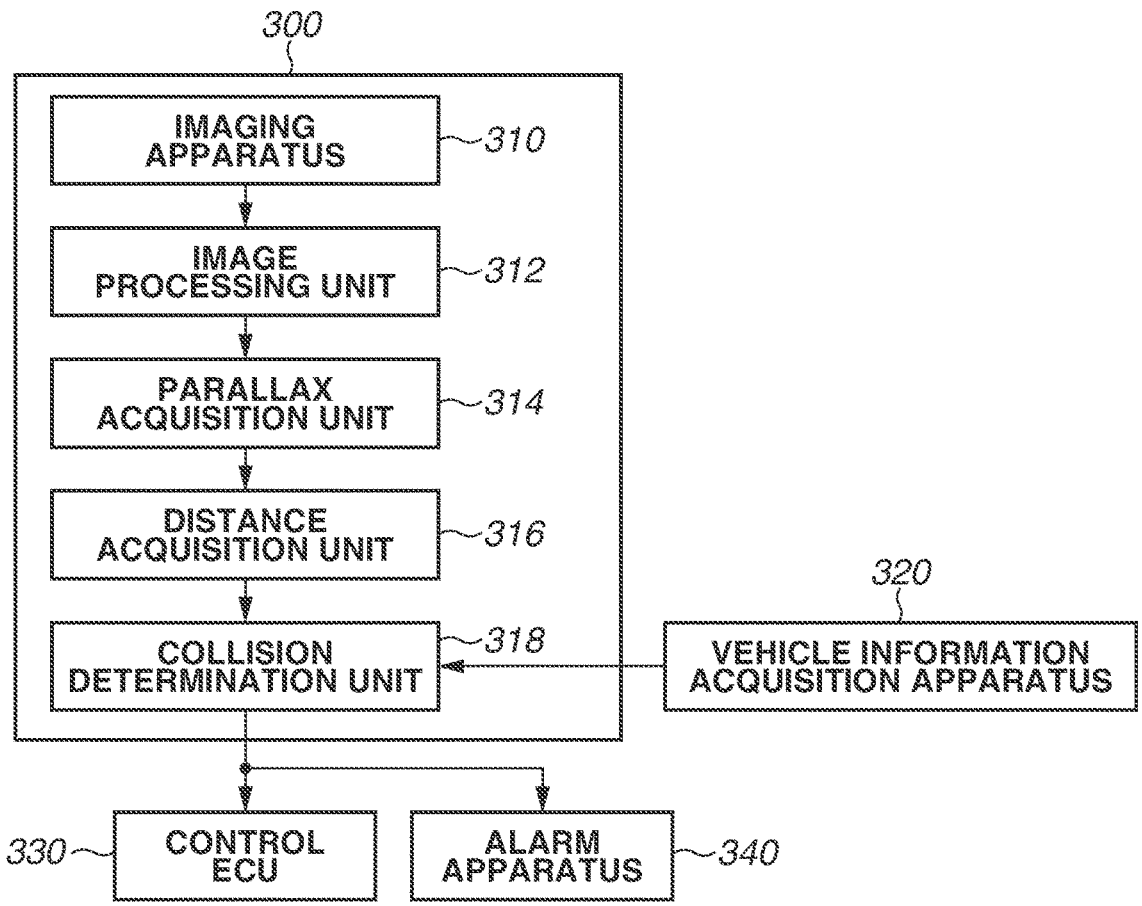
FIGS. 30A and 30B are diagrams illustrating a configuration and an operation of a photoelectric conversion system in a movable body according to a tenth exemplary embodiment.
Figure 30B:
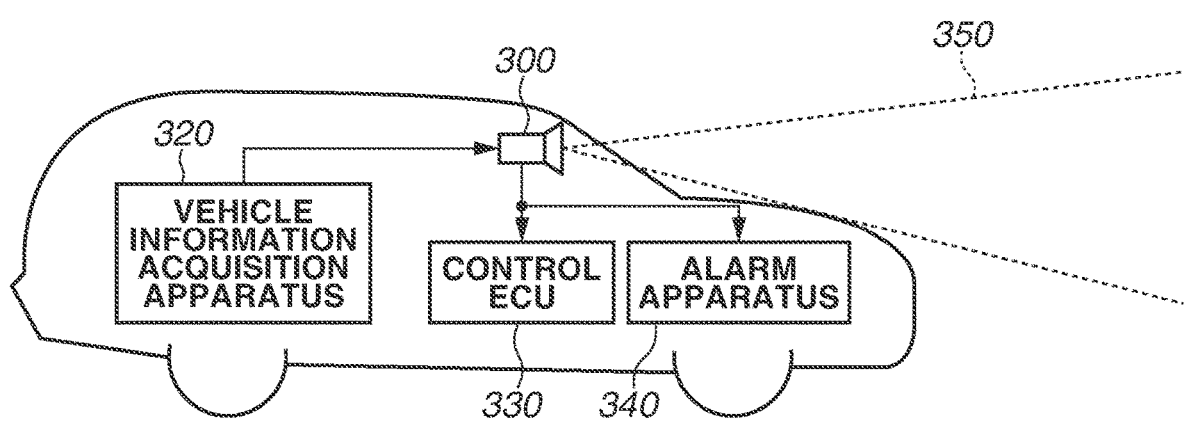

A photoelectric conversion system and a movable body according to a tenth exemplary embodiment of the present disclosure will be described with reference to FIGS. 30A and 30B. FIGS. 30A and 30B are diagrams illustrating configurations of the photoelectric conversion system and the movable body according to the present exemplary embodiment, respectively.

FIG. 30A illustrates an example of a photoelectric conversion system 300 related to an in-vehicle camera. The photoelectric conversion system 300 includes an imaging apparatus 310. The imaging apparatus 310 is the photoelectric conversion apparatus (imaging apparatus) according to any of the above-described exemplary embodiments. The photoelectric conversion system 300 also includes an image processing unit 312 that performs image processing on a plurality of pieces of image data acquired by the imaging apparatus 310, and a parallax acquisition unit 314 that calculates a parallax (phase difference between parallax images) from the plurality of pieces of image data acquired by the photoelectric conversion system 300. The photoelectric conversion system 300 further includes a distance acquisition unit 316 that calculates the distance to a target object based on the calculated parallax, and a collision determination unit 318 that determines whether collision is likely to occur, based on the calculated distance. In this example, the parallax acquisition unit 314 and the distance acquisition unit 316 serve as an example of a distance information acquisition unit that acquires distance information regarding the distance to a target object. More specifically, the distance information is information regarding the parallax, the amount of defocus, the distance to a target object, and the like. The collision determination unit 318 may determine the likelihood of collision using any of these pieces of distance information. The distance information acquisition unit may be implemented by dedicatedly-designed hardware, or may be implemented by a software module. Alternatively, the distance information acquisition unit may be implemented by a field programmable gate array (FPGA) or an application specific integrated circuit (ASIC), or may be implemented by the combination of these.

The photoelectric conversion system 300 is connected to a vehicle information acquisition apparatus 320, and can acquire vehicle information such as a vehicle speed, a yaw rate, or a steering angle. In addition, a control electronic control unit (ECU) 330 is connected to the photoelectric conversion system 300. The control ECU 330 serves as a control apparatus that outputs, to a vehicle, a control signal for generating a braking force, based on a result of the determination made by the collision determination unit 318. The photoelectric conversion system 300 is also connected to an alarm apparatus 340 that raises an alarm to a driver based on the result of the determination made by the collision determination unit 318. For example, if the result of the determination indicates a high collision likelihood, the control ECU 330 performs vehicle control to avoid collision or reduce damage, for example, by braking, pushing back the accelerator, or suppressing the engine output. The alarm apparatus 340 warns the user, for example, by sounding an alarm, displaying warning information on the screen of a car navigation system, or vibrating the seatbelt or the steering wheel.

In the present exemplary embodiment, the photoelectric conversion system 300 captures an image of the periphery of the vehicle such as the front side or the rear side. FIG. 30B illustrates the photoelectric conversion system 300 that captures an image of a vehicle front side (an imaging range 350). The vehicle information acquisition apparatus 320 issues an instruction to the photoelectric conversion system 300 or the imaging apparatus 310. With this configuration, the accuracy of distance measurement can be further enhanced.

The above description has been given of the example in which control is performed so as not to collide with another vehicle. The photoelectric conversion system can also be applied to the control for performing automatic operation while following another vehicle, or the control for performing automatic operation so as not to deviate from a lane. Furthermore, the photoelectric conversion system can be applied to a movable body (moving apparatus) such as a vessel, an aircraft, or an industrial robot aside from a privately-owned vehicle. Moreover, the photoelectric conversion system can be applied to a device that extensively uses object recognition, such as an intelligent transport system (ITS), in addition to a movable body.

Modified Exemplary Embodiment

The present disclosure is not limited to the above-described exemplary embodiments, and various modifications can be made.

For example, an example in which a part of the configuration according to any of the exemplary embodiments is added to any of the other exemplary embodiments, and an example in which a part of the configuration according to any of the exemplary embodiments is replaced with a part of the configuration according to any of the other exemplary embodiments are also included in the exemplary embodiments of the present disclosure.

In addition, the photoelectric conversion systems according to the above-described ninth and tenth exemplary embodiments are examples of the photoelectric conversion system to which the photoelectric conversion apparatus according to any of the exemplary embodiments can be applied. The photoelectric conversion system to which the photoelectric conversion apparatus according to any of the exemplary embodiments can be applied is not limited to the configurations illustrated in FIGS. 29, 30A, and 30B.

The above-described exemplary embodiments merely indicate implementation examples for carrying out the present disclosure, and the technical scope of the present disclosure is not to be construed in a limited way based on these exemplary embodiments. The present disclosure can be implemented in various forms without departing from the technical idea thereof or the major characteristics thereof.

According to the exemplary embodiments of the present disclosure, it is possible to reduce the change of the characteristics of a protection circuit caused by wire bonding formation, and is therefore possible to suppress a reduction in the signal accuracy and operation reliability of a photoelectric conversion apparatus.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read-only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-084828, filed May 14, 2020, which is hereby incorporated by reference herein in its entirety.

What is claimed is:

1. A photoelectric conversion apparatus in which a first semiconductor substrate, which includes a plurality of photoelectric conversion units each configured to receive incident light and generate signal charge, and a second semiconductor substrate, which includes at least one signal processing circuit configured to process an input signal that is based on the generated signal charge, are laminated, the photoelectric conversion apparatus comprising:
  a pad configured to receive a power supply voltage as input from an outside of the photoelectric conversion apparatus;
  a first protection circuit provided on the first semiconductor substrate and including a first diode and a second diode; and
  a second protection circuit provided on the second semiconductor substrate and including a third diode and a fourth diode,
  wherein the first diode and the second diode and the third diode and the fourth diode are provided on an outside of a region in which the pad is provided, in planar view,
  wherein at least one of the first protection circuit or the second protection circuit is connected to the pad, and
  wherein the first protection circuit and the second protection circuit are provided at a position where at least a part of the first diode and at least a part of the third diode overlap in the planar view or at least a part of the second diode and at least a part of the fourth diode overlap in the planar view.

2. The photoelectric conversion apparatus according to claim 1, wherein the first protection circuit and the second protection circuit are provided at a position where the first protection circuit includes the second protection circuit in the planar view or the second protection circuit includes the first protection circuit in the planar view.

3. The photoelectric conversion apparatus according to claim 2, wherein both the first protection circuit and the second protection circuit are connected to the pad.

4. The photoelectric conversion apparatus according to claim 1, wherein the second protection circuit is provided at a position overlapping the pad in the planar view.

5. The photoelectric conversion apparatus according to claim 4, wherein both the first protection circuit and the second protection circuit are connected to the pad.

6. The photoelectric conversion apparatus according to claim 1, wherein both the first protection circuit and the second protection circuit are connected to the pad.

7. The photoelectric conversion apparatus according to claim 1, further comprising a power supply wiring line configured to supply the power supply voltage to the at least one signal processing circuit,
  wherein the second protection circuit is connected to the power supply wiring line.

8. The photoelectric conversion apparatus according to claim 1, wherein the pad is connected to a wiring line, in a wiring layer, arranged at a depth different from a depth at which the pad is provided, and at least one of the first protection circuit or the second protection circuit overlaps the wiring line in the planar view.

9. The photoelectric conversion apparatus according to claim 1,
  wherein a wiring line is arranged in a wiring layer provided on the second semiconductor substrate, and the wiring line is arranged at a depth different from a depth at which the pad is provided,
  wherein the pad is connected to the wiring line, and the wiring line is connected to a plurality of protection circuits, including the second protection circuit, provided on the second semiconductor substrate.

10. A photoelectric conversion system comprising:
  the photoelectric conversion apparatus according to claim 1; and
  a signal processing unit configured to generate an image using a signal output by the photoelectric conversion apparatus.

11. A movable body including the photoelectric conversion apparatus according to claim 1, the movable body comprising:
  a control unit configured to control a movement of the movable body using a signal output by the photoelectric conversion apparatus.

12. The photoelectric conversion apparatus according to claim 1, further comprising an element isolation region provided between one of two or more semiconductor regions comprising the first diode and another one of the two or more semiconductor regions comprising the second diode,
  wherein the element isolation region is provided on the outside of the region in which the pad is provided, in the planar view.

13. The photoelectric conversion apparatus according to claim 1, further comprising an element isolation region provided between one of two or more semiconductor regions comprising the third diode and another one of the two or more semiconductor regions comprising the fourth diode,
  wherein the element isolation region is provided on the outside of the region in which the pad is provided, in the planar view.

14. A photoelectric conversion apparatus in which a first semiconductor substrate, which includes a plurality of photoelectric conversion units each configured to receive incident light and generate signal charge, and a second semiconductor substrate, which includes at least one signal processing circuit configured to process an input signal that is based on the generated signal charge, are laminated, the photoelectric conversion apparatus comprising:
- a pad configured to receive a power supply voltage as input from an outside of the photoelectric conversion apparatus;
- a first protection circuit provided on the first semiconductor substrate and including a plurality of diodes; and
- a second protection circuit provided on the second semiconductor substrate and including a plurality of diodes,
- wherein the plurality of diodes of the first protection circuit and the plurality of diodes of the second protection circuit are provided on an outside of a region in which the pad is provided, in planar view,
- wherein at least one of the first protection circuit or the second protection circuit is connected to the pad,
- wherein the pad is provided between an edge of the second semiconductor substrate closest to the pad and the plurality of diodes of the second protection circuit in plan view, and
- wherein the first protection circuit and the second protection circuit are provided at a position where at least a part of the first protection circuit and at least a part of the second protection circuit overlap in the planar view.

15. The photoelectric conversion apparatus according to claim 14,
- wherein the photoelectric conversion apparatus comprises a sensor array including the plurality of photoelectric conversion units arranged in rows and columns, and
- wherein the plurality of diodes of the first protection circuit and the plurality of diodes of the second protection circuit are provided between the pad and the first protection circuit and the sensor array in the plan view.

16. The photoelectric conversion apparatus according to claim 1, further comprising a bonding portion to connect the first semiconductor substrate and the second semiconductor substrate,
- wherein the first protection circuit, the second protection circuit, and the pad are bonded to the bonding portion.

17. The photoelectric conversion apparatus according to claim 1, wherein the first diode and the second diode and the third diode and the fourth diode are bonded to the pad.

18. The photoelectric conversion apparatus according to claim 1, wherein the first protection circuit and the second protection circuit are protection circuits to protect the photoelectric conversion apparatus from an electrostatic discharge.

19. The photoelectric conversion apparatus according to claim 1, wherein the first protection circuit and the second protection circuit are provided at a position where at least a part of the first diode and at least a part of the third diode overlap in the planar view and at least a part of the second diode and at least a part of the fourth diode overlap in the planar view.

20. The photoelectric conversion apparatus according to claim 14,
- wherein the first protection circuit includes a first diode and a second diode,
- wherein the second protection circuit includes a third diode and a fourth diode, and
- wherein the first protection circuit and the second protection circuit are provided at a position where at least a part of the first diode and at least a part of the third diode overlap in the planar view or at least a part of the second diode and at least a part of the fourth diode overlap in the planar view.

21. The photoelectric conversion apparatus according to claim 14,
- wherein the first protection circuit includes a first diode and a second diode,
- wherein the second protection circuit includes a third diode and a fourth diode, and
- wherein the first protection circuit and the second protection circuit are provided at a position where at least a part of the first diode and at least a part of the third diode overlap in the planar view and at least a part of the second diode and at least a part of the fourth diode overlap in the planar view.

22. The photoelectric conversion apparatus according to claim 14, wherein the first protection circuit and the second protection circuit are provided at a position where the first protection circuit includes the second protection circuit in the planar view or the second protection circuit includes the first protection circuit in the planar view.

* * * * *